(12) United States Patent
Baek et al.

(10) Patent No.: US 8,005,562 B2
(45) Date of Patent: Aug. 23, 2011

(54) PROCESS-PARAMETER PROGNOSTIC SYSTEM FOR PREDICTING SHAPE OF SEMICONDUCTOR STRUCTURE, SEMICONDUCTOR FABRICATION APPARATUS HAVING THE SYSTEM, AND METHOD OF USING THE APPARATUS

(75) Inventors: Kye-Hyun Baek, Gyeonggi-do (KR); Yoon-Jae Kim, Seoul (KR); Yong-Jin Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 370 days.

(21) Appl. No.: 12/257,006

(22) Filed: Oct. 23, 2008

(65) Prior Publication Data
US 2009/0105853 A1    Apr. 23, 2009

(30) Foreign Application Priority Data
Oct. 23, 2007    (KR) ................ 10-2007-0106687

(51) Int. Cl.
*G06F 19/00*    (2011.01)
(52) U.S. Cl. ............ 700/110; 700/121; 703/2; 438/710
(58) Field of Classification Search .......... 700/110, 700/121; 703/2; 438/710
See application file for complete search history.

(56) References Cited

U.S. PATENT DOCUMENTS

| | | | |
|---|---|---|---|
| 6,060,895 A * | 5/2000 | Soh et al. | 324/750.28 |
| 6,110,214 A * | 8/2000 | Klimasauskas | 703/2 |
| 6,455,437 B1 * | 9/2002 | Davidow et al. | 438/710 |
| 6,616,759 B2 | 9/2003 | Tanaka et al. | |
| 6,726,767 B1 * | 4/2004 | Marrs et al. | 117/85 |
| 7,013,834 B2 * | 3/2006 | Tyler et al. | 118/723 E |
| 2005/0071038 A1 * | 3/2005 | Strang | 700/121 |
| 2005/0288812 A1 | 12/2005 | Cheng et al. | |

FOREIGN PATENT DOCUMENTS

| | | |
|---|---|---|
| JP | 2003-068717 | 3/2003 |
| JP | 2006-024195 | 1/2006 |
| KR | 1020030021324 A | 3/2003 |
| WO | WO 03/003437 A1 | 1/2003 |

* cited by examiner

*Primary Examiner* — Michael D Masinick
(74) *Attorney, Agent, or Firm* — Myers Bigel Sibley & Sajovec, P.A.

(57) ABSTRACT

Provided are a process-parameter prognostic system for predicting the shape of a semiconductor structure, a semiconductor fabrication apparatus having the process-parameter prognostic system, and a method of using the same. The process-parameter prognostic system may have a process prediction unit and a process-change point corresponding unit. The process prediction unit and the process-change point corresponding unit may obtain predicted parameters using measured parameters of semiconductor structures and sensor parameters of plasmas corresponding to the semiconductor structures.

5 Claims, 10 Drawing Sheets

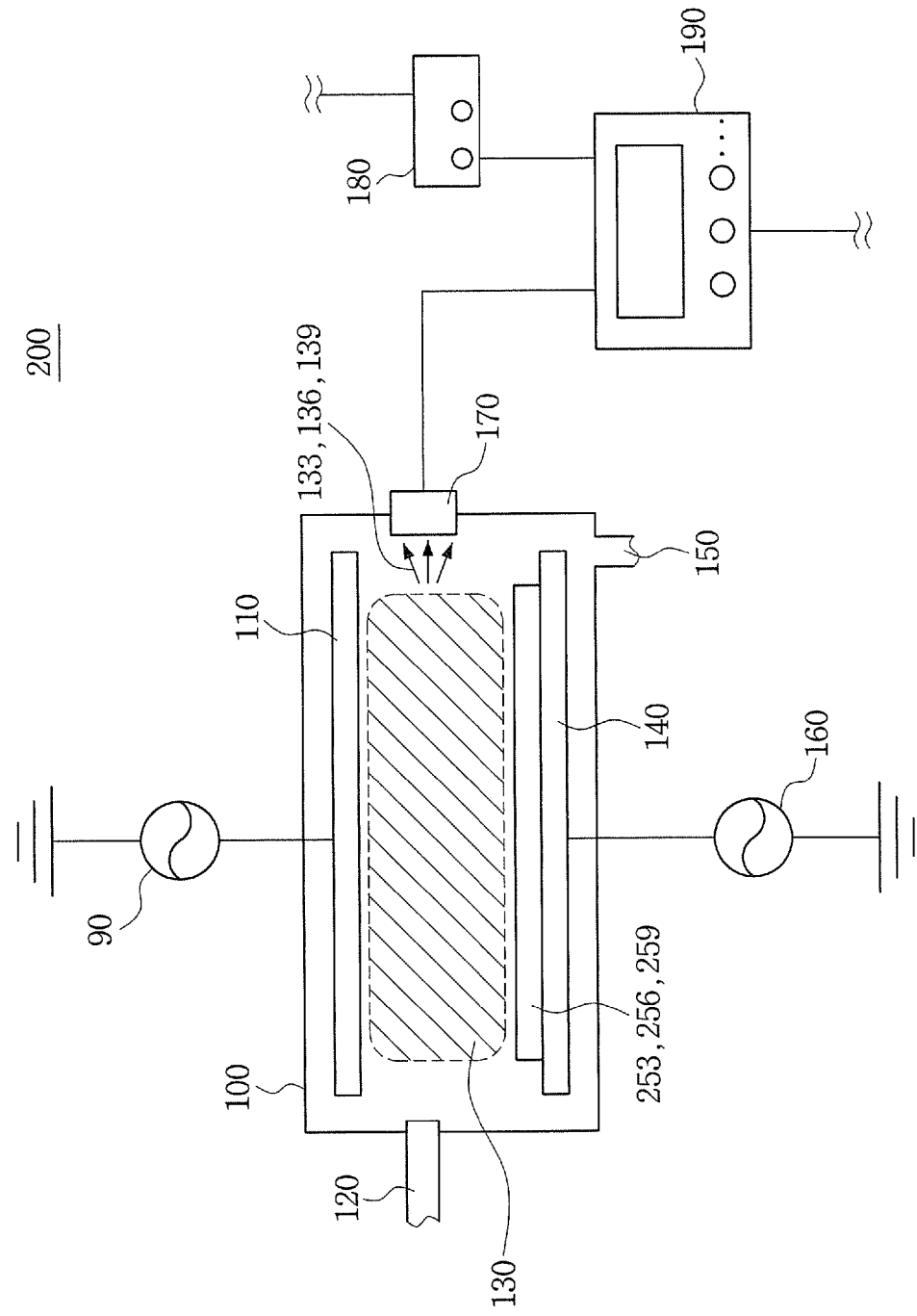

PROCESS-PARAMETER PROGNOSTIC SYSTEM FOR PREDICTING SHAPE OF SEMICONDUCTOR STRUCTURE, SEMICONDUCTOR FABRICATION APPARATUS HAVING THE SYSTEM, AND METHOD OF USING THE APPARATUS

CROSS REFERENCE TO RELATED APPLICATION

This application claims priority to Korean Application Serial No. 10-2007-0106687, filed Oct. 23, 2007, the disclosure of which is hereby incorporated herein by reference.

FIELD OF THE INVENTION

Exemplary embodiments relate to a process-parameter prognostic system for predicting the shape of a semiconductor structure, a semiconductor fabrication apparatus having the system, and a method of using the apparatus.

BACKGROUND

In general, a semiconductor fabrication apparatus may generate plasma during dry etching of a semiconductor structure. The plasma may be generated by a physical and/or chemical reaction of a reactant gas with the semiconductor structure in a process chamber of the semiconductor fabrication apparatus. The plasma may be exposed at specific frequencies from the process chamber of the semiconductor fabrication apparatus during the dry etching of the semiconductor structure. Process environments of the process chamber, a process-change point of a semiconductor fabrication process, or the shape of the semiconductor structure may be explained based on the specific frequencies of the plasma. Accordingly, the plasma can be captured from the process chamber during the dry etching of the semiconductor structure and used to predict the shape of the semiconductor structure.

SUMMARY

Exemplary embodiments provide a process-parameter prognostic system for predicting a shape of a semiconductor structure based on linearity between sensor parameters of plasmas and measured parameters of semiconductor structures and a semiconductor fabrication apparatus having the process-parameter prognostic system.

Exemplary embodiments provide a method of using a semiconductor fabrication apparatus having a prognostic system for appropriately adjusting the number of semiconductor structures in the order of a semiconductor fabrication process and generating predicted parameters to predict the shapes of the semiconductor structures.

One aspect according to the exemplary embodiments are directed to a process-parameter prognostic system including a process prediction unit and a process-change point corresponding unit. The process prediction unit may calculate predicted parameters using measured parameters of semiconductor structures and sensor parameters of plasmas of a process chamber corresponding to the semiconductor structures. In detail, the process prediction unit may obtain a process-predicting model equation based on selected measured parameters and selected predicted parameters of selected semiconductor structures.

Also, the process prediction unit may repetitively rebuild the process-predicting model equation based on the sensor parameters by adjusting the number of the selected semiconductor structures and the number of the remaining semiconductor structures in the order of a semiconductor fabrication process, thereby obtaining the remaining predicted parameters corresponding to the process-predicting model equation.

The process-change point corresponding unit may compare selected sensor parameters corresponding to the selected predicted parameters with the remaining sensor parameters corresponding to the remaining predicted parameters and confirm process environments in the process chamber.

In selected exemplary embodiments, each of the semiconductor structures may be one selected from a structure limited to a semiconductor substrate and a structure limited to a material layer disposed on and different from the semiconductor substrate. The measured parameters may be actual numerical figures for limiting the shape of the semiconductor structures, and the predicted parameters may be expected numerical figures for estimating the shape of the semiconductor structures.

In selected exemplary embodiments, the sensor parameters may be classified to correspond to at least two different process items. The at least two different process items may correspond to the semiconductor structures, respectively, and correspond to independent variables, respectively, of the process-predicting model equation.

In selected exemplary embodiments, each of the sensor parameters may be an average radio frequency of a waveform obtained between specific points in time during performance of the semiconductor fabrication process.

In selected exemplary embodiments, the process-predicting model equation may have linearity between the selected measured parameters and the selected predicted parameters.

In selected exemplary embodiments, the process prediction unit may determine a boundary condition for the process-predicting mode equation using the selected sensor parameters and compare the boundary condition with the remaining parameters.

In selected exemplary embodiments, the boundary condition may be one selected from a maximum value, a minimum value, an average value, a standard deviation value, which are obtained using the sensor parameters according to the at least two different process items, and a statistical value obtained using the maximum value, the minimum value, the average value, and/or the standard deviation value.

In other exemplary embodiments, when the remaining sensor parameters satisfy the boundary condition, the process prediction unit may replace a previously fabricated one of the selected semiconductor structures with a previously fabricated one of the remaining semiconductor structures to generate a first specific predicted parameter, replace a subsequently fabricated one of the selected semiconductor structures with a subsequently fabricated one of the remaining semiconductor structures to generate a second specific predicted parameter, and repetitively perform the same process as the process of generating each of the first and second specific predicted parameters, in order, to generate the predicted parameters. Moreover, the boundary condition may be repetitively rebuilt based on the process-predicting model equation using the selected sensor parameters and the remaining sensor parameters.

In other exemplary embodiments, when sensor parameters corresponding to the at least two different process items of the remaining sensor parameters do not satisfy the boundary condition, the process prediction unit may transmit the sensor parameters corresponding to the at least two different process items to the process-change point corresponding unit. Also, the process-change point corresponding unit may confirm the process environments in the process chamber based on the sensor parameters corresponding to the at least two different process items and the selected sensor parameters to select one from a management or a removal of the sensor parameters corresponding to the at least two different process items.

In other exemplary embodiments, when the process-change point corresponding unit selects to remove the sensor parameters corresponding to the at least two different process items, the process-change point corresponding unit may stop the drive of a semiconductor fabrication apparatus.

Another aspect according to the exemplary embodiments is directed to a semiconductor fabrication apparatus having a process-parameter prognostic system including a process chamber for generating plasmas between semiconductor structures and a process gas. A sensor for capturing sensor parameters of the plasmas is disposed on a sidewall of the process chamber. A memory module is disposed to store measured parameters of the semiconductor structures detached from the process chamber. The process-parameter prognostic system is electrically connected to the sensor and the memory module and includes a process prediction unit and a process-change point corresponding unit. The process-parameter prognostic system obtains predicted parameters using the process prediction unit and the process-change point corresponding unit.

In this case, the process prediction unit obtains a process-predicting model equation based on selected measured parameters and selected predicted parameters of selected semiconductor structures. Also, the process prediction unit repetitively rebuilds the process-predicting model equation based on the sensor parameters by adjusting the number of the selected semiconductor structures and the number of the remaining semiconductor structures in the order of a semiconductor fabrication process and obtains the remaining predicted parameters corresponding to the process-predicting model equation. Also, the process-change point corresponding unit compares selected parameters corresponding to the selected predicted parameters with the remaining sensor parameters corresponding to the remaining predicted parameters and confirms a process-change point in the process chamber.

In selected exemplary embodiments, the process prediction unit may rebuild a boundary condition for the process-predicting mode equation using the sensor parameters and compare the boundary condition with the remaining sensor parameters.

When a part of the remaining sensor parameters does not satisfy the boundary condition, the process-change point corresponding unit may allow the part of the remaining sensor parameters to correspond to the selected sensor parameters and confirm the process environments in the process chamber.

Yet another aspect according to the exemplary embodiments is directed to a method of using a semiconductor fabrication apparatus having a process-parameter prognostic system. The method includes a first step of reacting semiconductor structures with a process gas and sequentially generating plasmas in a process chamber. In a second step, sensor parameters are obtained from the plasmas using a sensor, and measured parameters are obtained from the semiconductor structures detached from the process chamber using a measuring machine. In a third step, a process-predicting model equation and a boundary condition are determined based on linearity between selected measured parameters corresponding to selected semiconductor structures and selected sensor parameters using a process prediction unit. In a fourth step, sensor parameters of a previously fabricated one of the remaining semiconductor structures are compared with the boundary condition using the process prediction unit. In this case, the semiconductor structures are classified in the order of a semiconductor fabrication process. Also, the selected semiconductor structures are fabricated earlier than the remaining semiconductor structures.

In selected exemplary embodiments, the measuring machine may be disposed apart from the semiconductor fabrication apparatus. Also, the measured parameters may be actual numerical values for limiting the shape of the semiconductor structures and stored in a memory module of the semiconductor fabrication apparatus.

In selected exemplary embodiments, the sensor may be disposed on a sidewall of the process chamber. The sensor parameters may be classified to correspond to at least two different process items. The at least two different process items may correspond to the semiconductor structures, respectively, and correspond to independent variables, respectively, of the process-predicting model equation.

In selected exemplary embodiments, each of the sensor parameters may be an average radio frequency of a waveform obtained between specific points in time during the semiconductor fabrication process.

In selected exemplary embodiments, the boundary condition may be one selected from a maximum value, a minimum value, an average value, a standard deviation value, which are obtained using the sensor parameters according to the at least two different process items, and a statistical value obtained using the maximum value, the minimum value, the average value, and/or the standard deviation value.

In selected exemplary embodiments, when the sensor parameters of the previously fabricated one of the remaining semiconductor structures satisfy the boundary condition, the method may further include a fifth step of, using the process prediction unit, replacing a previously fabricated one of the selected semiconductor structures with the previously fabricated one of the remaining semiconductor structures to generate specific sensor parameters and rebuilding the process-predicting model equation and the boundary condition. In a sixth step, by use of the process prediction unit, an average value of specific sensor parameters may be obtained according to the at least two different process items and the average value of the specific sensor parameters may be substituted into the rebuilt process-predicting model equation to generate predicted parameters. In a seventh step, the predicted parameters may be compared with a final semiconductor structure using the process prediction unit.

In selected exemplary embodiments, when the sensor parameters of the previously fabricated one of the remaining semiconductor structures satisfy the boundary condition and the predicted parameter is not obtained using specific sensor parameters of the final semiconductor structure, the method may further include an eighth step of, using the process prediction unit, storing the predicted parameter in the semiconductor fabrication apparatus and repetitively performing the fourth through seventh steps in order until all the selected semiconductor structures are replaced by the remaining semiconductor structures to generate the remaining predicted parameters.

In selected exemplary embodiments, when the sensor parameters of the previously fabricated one of the remaining semiconductor structures satisfy the boundary condition and the predicted parameter is obtained using the specific sensor parameters of the final semiconductor structure, the method may further include a ninth step of comparing the measured parameters with the predicted parameters using the semiconductor fabrication apparatus. In this case, a plurality of predicted parameters may be obtained.

In other exemplary embodiments, when the sensor parameters of the previously fabricated one of the remaining semiconductor structures do not satisfy the boundary condition, the method may further include a tenth step of transmitting the sensor parameters of the previously fabricated one of the remaining semiconductor structures to a process-change point corresponding unit using the process prediction unit. In this case, the process prediction unit and the process-change point corresponding unit may constitute the process-parameter prognostic system. In an eleventh step, the sensor parameters of the previously fabricated one of the remaining semiconductor structures may be compared with the selected sensor parameters to confirm generation of a process-change point.

In other exemplary embodiments, when the sensor parameters of the previously fabricated one of the remaining semiconductor structures do not satisfy the boundary condition and the process-change point is not generated, the method may further include a twelfth step of transmitting the sensor parameters of the previously fabricated one of the remaining semiconductor structures to the process prediction unit using the process-change point corresponding unit to continuously manage the sensor parameters of the previously fabricated one of the remaining semiconductor structures. In a thirteenth step, by use of the process prediction unit, the previously fabricated one of the selected semiconductor structures may be replaced by the previously fabricated one of the remaining semiconductor structures to generate specific sensor parameters and the process-predicting model equation and the boundary condition may be rebuilt. In a fourteenth step, by use of the process prediction unit, an average value of specific sensor parameters are obtained according to the at least two different process items and the average value of the specific sensor parameters are substituted into the rebuilt process-predicting model equation to generate a predicted parameter. In a fifteenth step, the predicted parameter may be compared with a final semiconductor structure using the process prediction unit.

In other exemplary embodiments, when the sensor parameters of the previously fabricated one of the remaining semiconductor structures do not satisfy the boundary condition and the predicted parameter is not obtained using specific sensor parameters of the final semiconductor structure, the method may further include a sixteenth step of, using the process prediction unit, storing the predicted parameter in the semiconductor fabrication apparatus and returning to the fourth step and repetitively performing the fourth through fifteenth in order until all the selected semiconductor structures are replaced by the remaining semiconductor structures to generate predicted parameters.

In other exemplary embodiments, when the sensor parameters of the previously fabricated one of the remaining semiconductor structures do not satisfy the boundary condition and the predicted parameter is obtained using the specific sensor parameters of the final semiconductor structure, the method may further include a seventeenth step of comparing the measured parameters with the predicted parameters using the semiconductor fabrication apparatus. In this case, a plurality of predicted parameters may be obtained.

In other exemplary embodiments, when the sensor parameters of the previously fabricated one of the remaining semiconductor structures do not satisfy the boundary condition and the process-change point is generated, the method may further include an eighteenth step of removing the sensor parameters of the previously fabricated one of the remaining semiconductor structures using the process-change point corresponding unit. In a nineteenth step, by use of the process-change point corresponding unit, the drive of the semiconductor fabrication apparatus may be stopped, the cause of the process-change point may be recognized, and measures may be taken against the process-change point. In a twentieth step, the method may return to the first step to continuously drive the semiconductor fabrication apparatus using the process-change point corresponding unit after the measures are taken against the process-change point.

BRIEF DESCRIPTION OF THE DRAWINGS

Exemplary embodiments will be apparent from the more particular description thereof, as illustrated in the accompanying drawings. The drawings are not necessarily to scale, emphasis instead being placed upon illustrating the principles of the exemplary embodiments.

FIG. 2 is a schematic view showing a semiconductor fabrication apparatus according to exemplary embodiments.

DETAILED DESCRIPTION

Figure 1:
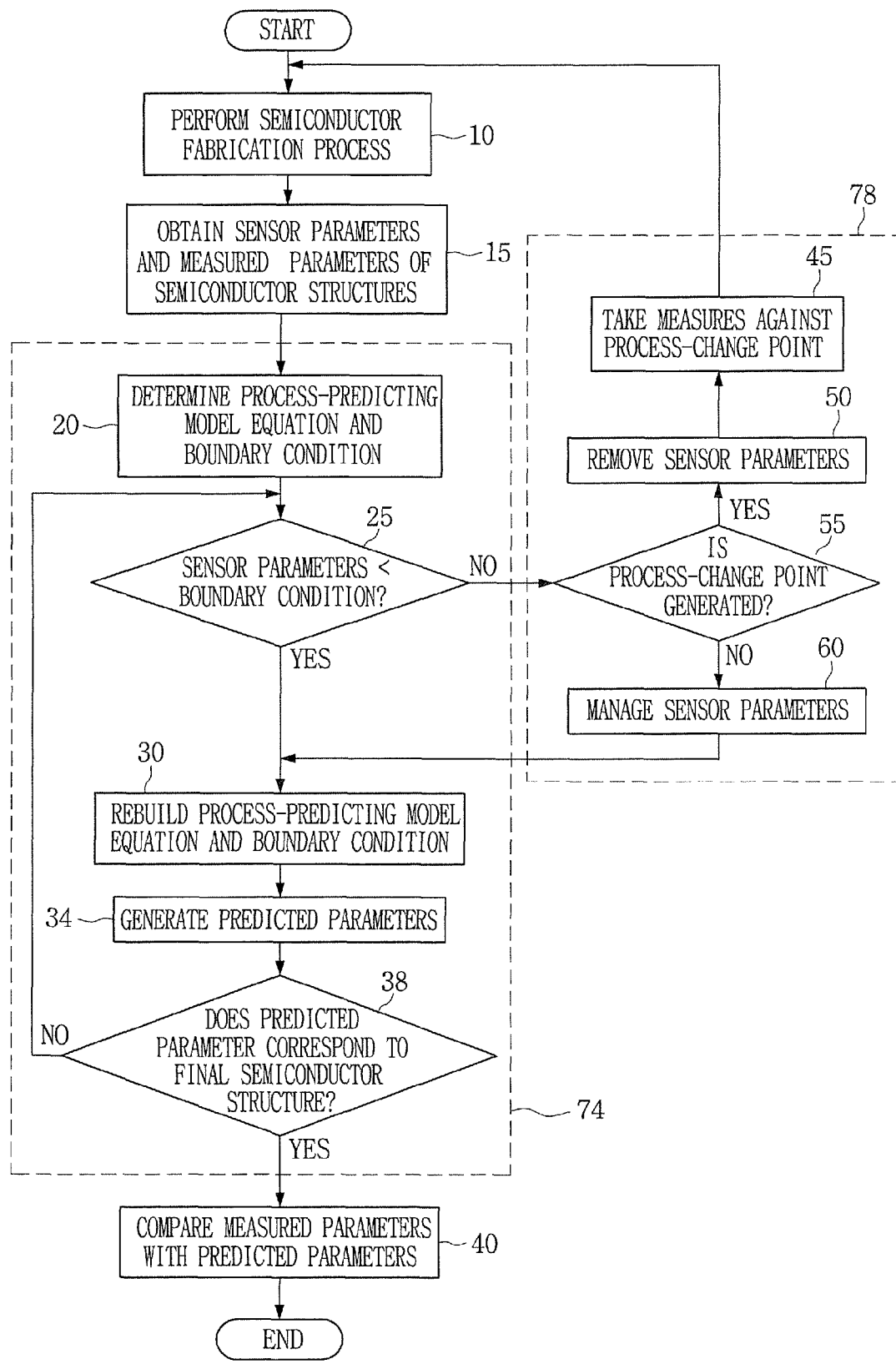
FIG. 1 is a process flowchart illustrating a method of obtaining predicted parameters according to exemplary embodiments.

Exemplary embodiments will be described more fully hereinafter with reference to the accompanying drawings, in which the exemplary embodiments are shown. The exemplary embodiments may, however, be embodied in different forms and should not be construed as limited to the embodiments set forth herein. Rather, the exemplary embodiments are provided so that this disclosure is thorough and complete and fully conveys the scope of the inventive concept to one skilled in the art. It will be understood that although the terms first and second are used herein to describe various members, devices, regions, layers, and/or sections, the members, devices, regions, layers and/or sections should not be limited by these terms. These terms are only used to distinguish one member, device, region, layer or section from another member, device, region, layer or section.

As used herein, the term "measurement" may be used to describe an act of direct measurement of the shape of a semiconductor structure, and the term "prediction" may be used to describe an act of indirect estimation of the shape of the semiconductor structure. Also, the term "and/or" includes any and all combinations of one or more of the associated listed items. Spatially relative terms, such as "previously", "selected", "specific", "remaining", "measured", "predicted", and "on" and the like, may be used herein for ease of description to describe one element's relationship to (an) other element(s) as illustrated in the figures. The terminology used herein is for the purpose of describing particular embodiments only and is not intended to be limiting of the inventive concept. As used herein, the term "capture" can refer to the sampling of an environment to determine process parameters.

As appreciated by the present inventors, when a semiconductor fabrication process using a plasma is repeated, the semiconductor fabrication apparatus may not provide plasma corresponding to the shape of the semiconductor structure in real-time. This is because the semiconductor fabrication apparatus may adversely affect the process chamber due to a by-product of the reactant gas during the repetition of the semiconductor fabrication process. This adverse effect on the process chamber may cause the change of the process environments of the process chamber, so that the semiconductor fabrication apparatus may generate different plasma than before. The different plasma may be exposed from the process chamber at different specific frequencies than before the process environments are changed. Accordingly, the different plasma may be used to poorly predict the shape of the semiconductor structure.

In view of this appreciation, a process-parameter prognostic system for predicting the shapes of semiconductor structures, a semiconductor fabrication apparatus having the system, and a method of using the apparatus according to exemplary embodiments are described more fully hereinafter with reference to the accompanying drawings, in which the exemplary embodiments are shown.

FIG. 1 is a process flowchart illustrating a method of obtaining predicted parameters according to exemplary embodiments, and FIG. 2 is a schematic view showing a semiconductor fabrication apparatus according to exemplary embodiments. Further, FIGS. 3A through 3C are cross-sectional views showing a semiconductor structure shown in FIG. 2, according to a process flowchart of FIG. 1.

Referring to FIGS. 1 and 2, a process flowchart according to exemplary embodiments includes step 10 of performing a semiconductor fabrication process as shown in FIG. 1. In step 10, a semiconductor fabrication apparatus 200 may be prepared as shown in FIG. 2. The semiconductor fabrication apparatus 200 may have a process chamber 100. The process chamber 100 may have an upper electrode 110 and a lower electrode 140. The upper and lower electrodes 110 and 140 may be electrically connected to upper and lower power sources 90 and 160, respectively. Also, the process chamber 100 may have a process gas inlet port 120, a process gas outlet port 150, and a sensor 170. The semiconductor fabrication apparatus 200 may have a memory module 180 and a process-parameter prognostic system 190 adjacent to the process chamber 100. The process-parameter prognostic system 190 may be electrically connected to the sensor 170 and the memory module 180.

Figure 3A:
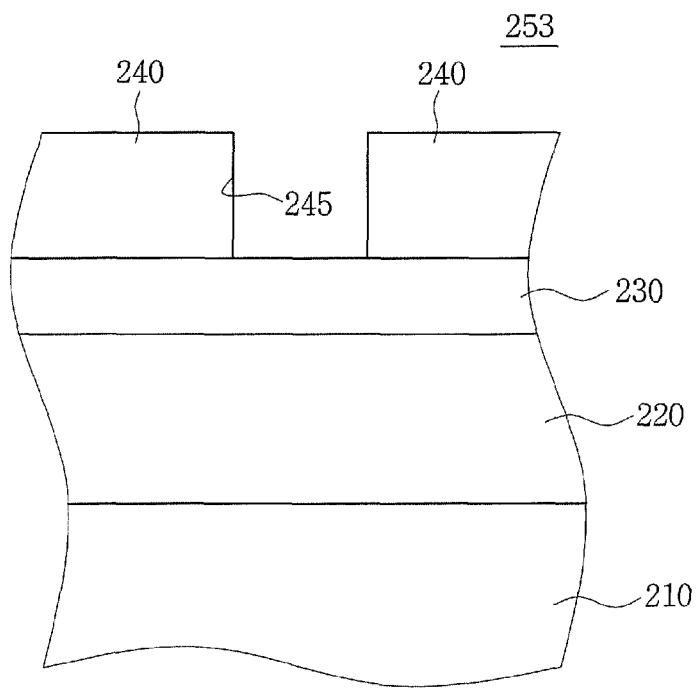
FIGS. 3A through 3C are cross-sectional views showing a semiconductor structure shown in FIG. 2, according to a process flowchart of FIG. 1.
Figure 3B:
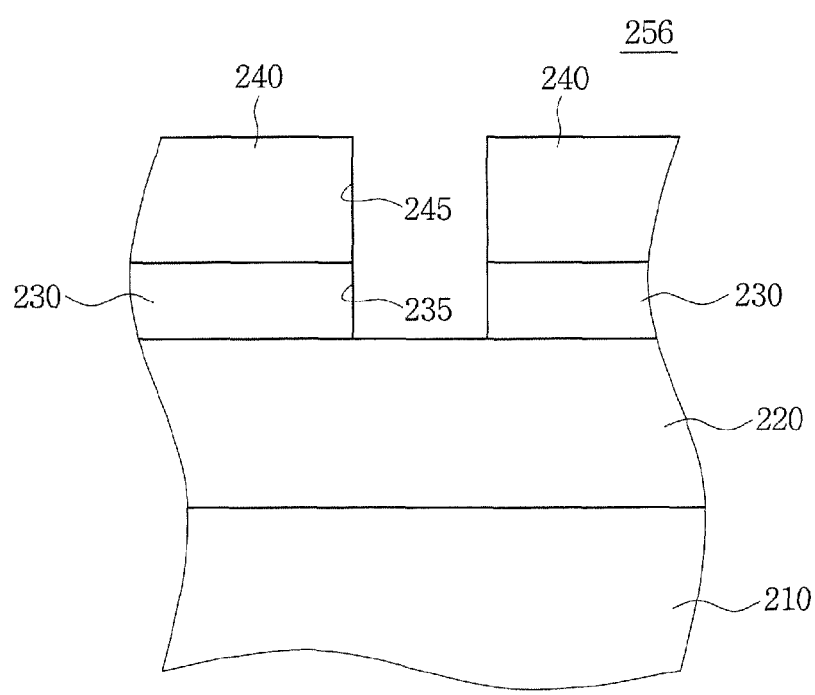
Figure 3C:
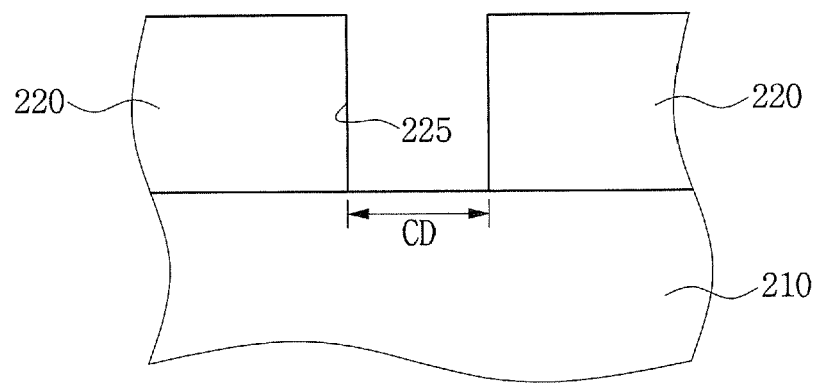

Referring to FIGS. 2 and 3A, in step 10 of FIG. 1, a semiconductor structure 253 may be loaded into the process chamber 100 of the semiconductor fabrication apparatus 200 as shown in FIG. 2. The semiconductor structure 253 may include a semiconductor substrate 210, an insulating layer 220, a mask layer 230, and a photoresist layer 240, which are stacked sequentially, as shown in FIG. 3A. The semiconductor substrate 210 may comprise one selected from the group consisting of single crystalline silicon, polycrystalline silicon (poly-Si), an insulating material, a conductive material, and a combination thereof. The insulating layer 220 may comprise a material having a different etch rate from the semiconductor substrate 210. The insulating layer 220 may be a silicon oxide layer. The mask layer 230 may comprise a material having a different etch rate from the insulating layer 220. The mask layer 230 may be a carbon layer. The photoresist layer 240 may have an opening 245 exposing the mask layer 230 as shown in FIG. 3A.

Referring again to FIGS. 2 and 3A, in step 10 of FIG. 1, a process gas 130 may be injected into the process chamber 100 as shown in FIG. 2. The process gas 130 may comprise different ions, different molecules, or a combination thereof. After the process gas 130 is injected into the process chamber 100, power may be respectively applied from the upper and lower power sources 90 and 160 to the upper and lower electrodes 110 and 140 included in the process chamber 100. The upper and lower power sources 90 and 160 may generate an electric field or magnetic field therebetween and dissociate the process gas 130 into atoms, atom groups, and molecules. The upper and lower power sources 90 and 160 may perform a first etch step on the mask layer 230 using the process gas 130 through the opening 245 of the photoresist layer 240 of the semiconductor structure 253 as shown in FIG. 3A.

Referring again back to FIGS. 2 and 3A, in step 10 of FIG. 1, the process gas 130 may remove an etch stop layer (not shown) disposed on the mask layer 230 during the first etch step. The etch stop layer may comprise an unwanted material having a different etch rate from the mask layer 230. That is, the etch stop layer may be formed between the mask layer 230 and the photoresist layer 240 under process environments of a semiconductor fabrication line during the formation of the mask layer 230 and the photoresist layer 230 shown in FIG. 3A. In this case, the process gas 130 may physically and/or chemically react with the etch stop layer, thus generating first plasma 133 as shown in FIG. 2. The first plasma 133 may be captured by the sensor 170 disposed on a sidewall of the process chamber 100 as shown in FIG. 2. The sensor 170 may transmit the first plasma 133 to the process-parameter prognostic system 190.

Referring to FIGS. 2 and 3B, in step 10 of FIG. 1, the process gas 130 may be used to perform a second etch step on the mask layer 230 through the opening 245 of the photoresist layer 240 of the semiconductor structure 253 of FIG. 3A as shown in FIG. 3B. The process gas 130 may remove the mask layer 230 exposed by the opening 245 of the photoresist layer 230 during the second etch step, thereby forming a semiconductor structure 256 having a new opening 235. In this case, the process gas 130 may physically and/or chemically react with the mask layer 230, thus generating second plasma 136 as shown in FIG. 2. The second plasma 136 may be captured by the sensor 170 disposed on the sidewall of the process chamber 100. The sensor 170 may transmit the second plasma 136 to the process-parameter prognostic system 190.

Referring to FIGS. 2 and 3C, in step 10 of FIG. 1, the process gas 130 may be used to perform a third etch step on the insulating layer 220 through the photoresist layer 240 and mask layer 230 of the semiconductor structure 256 of FIG. 3B as shown in FIG. 3C. The process gas 130 may remove the insulating layer 220 during the third etch step, thereby forming a semiconductor structure 259 having a through portion 225. The semiconductor structure 259 may expose the semiconductor substrate 210 through the opening 225 of the insulating layer 220, the opening 235 of the mask layer 230, and the opening 245 of the photoresist layer 240. In this case, the process gas 130 may physically and/or chemically react with the insulating layer 220, thus generating third plasma 139 as shown in FIG. 2. The third plasma 139 may be captured by the sensor 170 disposed on the sidewall of the process chamber 100. The sensor 170 may transmit the third plasma 139 to the process-parameter prognostic system 190. Next, the photoresist layer 240 and the mask layer 230 may be removed from the semiconductor structure 259.

Referring to FIGS. 2 and 3A through 3C, in step 10 of FIG. 1, the process gas of FIG. 2 may be used to generate different reactant gases in the first through third etch steps, thereby forming the semiconductor structures 253, 256, and 259 shown in FIGS. 3A through 3C. After the first through third etch steps are performed, the semiconductor structure 259 may be detached from the process chamber 100. The semiconductor fabrication apparatus 200 may repetitively perform the above-described semiconductor fabrication process and form a plurality of semiconductor structures 259. In step 15 of obtaining sensor and measured parameters of the semiconductor structures 259 shown in FIG. 1, a critical dimension (CD) of each of the semiconductor structures 259 may be measured using a measuring machine (not shown) disposed adjacent to the semiconductor fabrication apparatus 200. Meanwhile, the measuring machine may allow the size of the shape of each of the semiconductor structures 259 to correspond to measured parameters and store the size of the shape of each of the semiconductor structures 259 in the memory module 180 of the semiconductor fabrication apparatus 200.

The measured parameters may be numerically expressed using the measuring machine based on the shapes of the semiconductor structures 259. Accordingly, the measured parameters may include a measured CD, a measuring depth, a measured thickness, or a measured height. In exemplary embodiments, the measured CD will now be used as an example of the measured parameter.

Figure 4A:
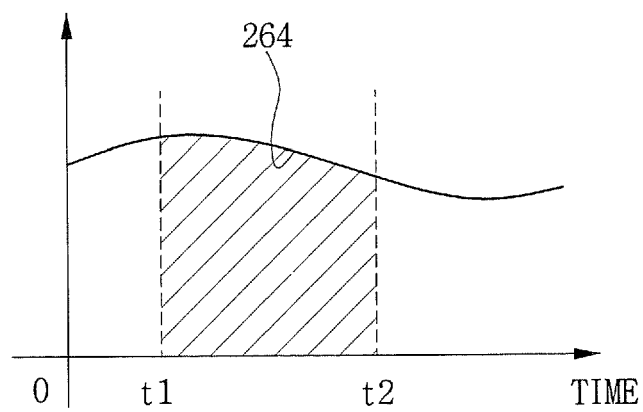
FIGS. 4A and 4B are graphs showing an electron collision rate and an electron density, respectively, which are measured in a first etching step of a semiconductor fabrication process shown in FIG. 3A.
Figure 4B:
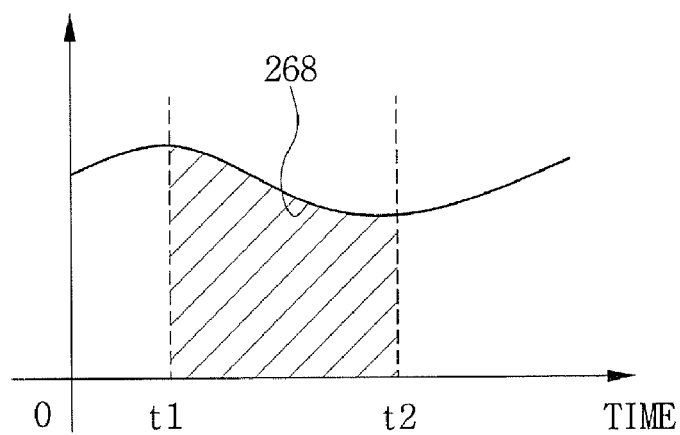
Figure 5A:
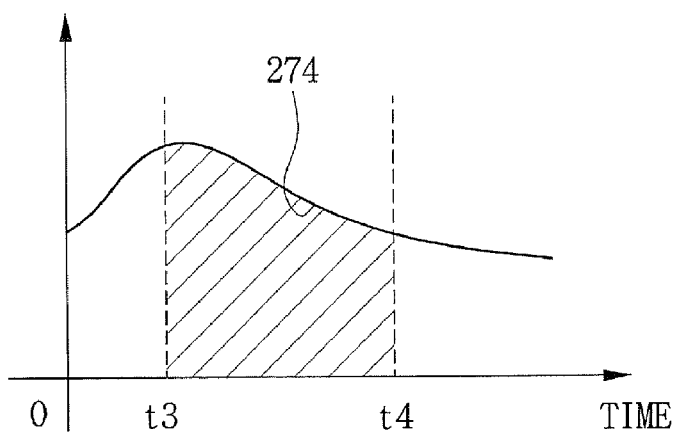
FIGS. 5A and 5B are graphs showing an electron collision rate and an electron density, respectively, which are measured in a second etching step of a semiconductor fabrication process shown in FIG. 3B.
Figure 5B:
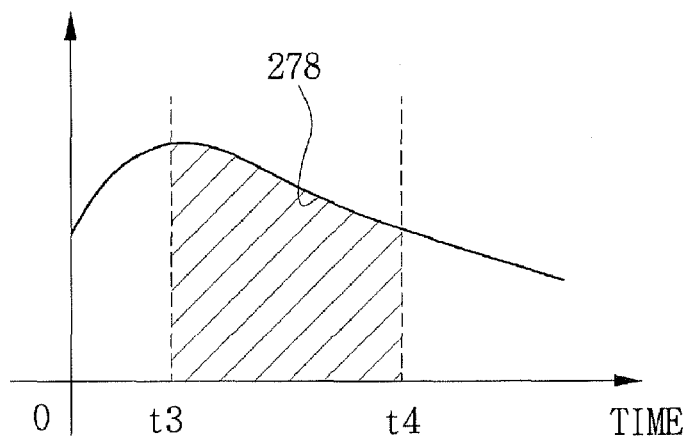
Figure 6A:
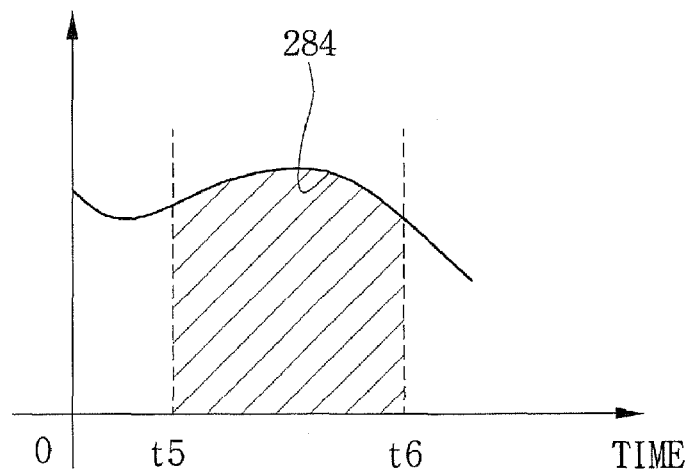
FIGS. 6A and 6B are graphs showing an electron collision rate and an electron density, respectively, which are measured in a third etching step of a semiconductor fabrication process shown in FIG. 3C.
Figure 6B:
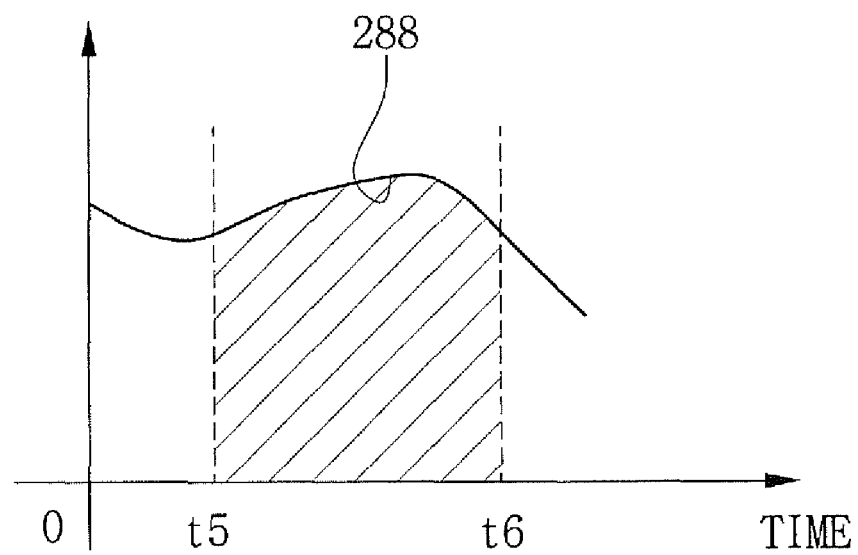

FIGS. 4A and 4B are graphs showing an electron collision rate and an electron density, respectively, which are measured in a first etching step of a semiconductor fabrication process shown in FIG. 3A. And FIGS. 5A and 5B are graphs showing an electron collision rate and an electron density, respectively, which are measured in a second etching step of a semiconductor fabrication process shown in FIG. 3B. Further, FIGS. 6A and 6B are graphs showing an electron collision rate and an electron density, respectively, which are measured in a third etching step of a semiconductor fabrication process shown in FIG. 3C.

Referring to FIGS. 4A and 4B, in step 15 of FIG. 1, the process-parameter prognostic system 190 of FIG. 2 may extract sensor parameters for featuring the first etch step from the first plasma 133. The sensor parameters may be an electron collision rate (1/sec) and the electron density (1/cm$^3$, Ne) of the first plasma 133 obtained between the first plasma 133 and the semiconductor structure 253. Changes of the electron collision rate and electron density with time may be shown in FIGS. 4A and 4B. The process-parameter prognostic system 190 may take an interest in waveforms 264 and 268 of the sensor parameters, which are obtained between specific points in time t1 and t2.

The process-parameter prognostic system 190 may obtain the average radio frequencies of the waveforms 264 and 268 obtained between the specific points in time t1 and t2 and allow the average radio frequencies to the sensor parameters of the semiconductor structures 253, respectively. Also, the process-parameter prognostic system 190 may store the average values of the sensor parameters. Alternatively, the waveform 264 of the electron collision rate may be obtained between the specific points in time t1 and t2. The waveform 268 of the electron density may be obtained between different points in time than the specific points in time t1 and t2. In addition, the sensor parameters may be other process items than the electron collision rate and the electron density.

Referring to FIGS. 5A and 5B, in step 15 of FIG. 1, the process-parameter prognostic system 190 of FIG. 2 may extract sensor parameters for featuring the second etch step from the second plasma 136. The sensor parameters may be an electron collision rate (1/sec) and the electron density (1/cm$^3$, Ne) of the second plasma 136 obtained between the second plasma 136 and the semiconductor structure 256. Changes of the electron collision rate and electron density with time may be shown in FIGS. 5A and 5B. The process-parameter prognostic system 190 may take an interest in waveforms 274 and 278 of the sensor parameters, which are obtained between specific points in time t3 and t4.

The process-parameter prognostic system 190 may obtain the average radio frequencies of the waveforms 274 and 278 obtained between the specific points in time t3 and t4 and allow the average radio frequencies to the sensor parameters of the semiconductor structures 256, respectively. Also, the process-parameter prognostic system 190 may continuously store the average values of the sensor parameters. Alternatively, the waveform 274 of the electron collision rate may be obtained between the specific points in time t3 and t4. The waveform 278 of the electron density may be obtained between different points in time than the specific points in time t3 and t4. In addition, the sensor parameters may be other process items than the electron collision rate and the electron density.

Referring to FIGS. 6A and 6B, in step 15 of FIG. 1, the process-parameter prognostic system 190 of FIG. 2 may extract sensor parameters for featuring the third etch step from the third plasma 139. The sensor parameters may be an electron collision rate (1/sec) and the electron density (1/cm$^3$, Ne) of the third plasma 139 obtained between the third plasma 139 and the semiconductor structure 259. Changes of the electron collision rate and electron density with time may be shown in FIGS. 6A and 6B. The process-parameter prognostic system 190 may take an interest in waveforms 284 and 288 of the sensor parameters, which are obtained between specific points in time t5 and t6.

The process-parameter prognostic system 190 may obtain the average radio frequencies of the waveforms 284 and 288 obtained between the specific points in time t5 and t6 and allow the average radio frequencies to the sensor parameters of the semiconductor structures 259, respectively. Also, the process-parameter prognostic system 190 may continuously store the average values of the sensor parameters. Alternatively, the waveform 284 of the electron collision rate may be obtained between the specific points in time t5 and t6. The waveform 288 of the electron density may be obtained between different points in time than the specific points in time t5 and t6. In addition, the sensor parameters may be other process items than the electron collision rate and the electron density.

Referring to FIGS. 4A, 4B, 5A, 5B, 6A, and 6B, in step 15 of FIG. 1, after the semiconductor fabrication process is repeated, the process-parameter prognostic system 190 of FIG. 2 may store the average value of the sensor parameters corresponding to each of the first through third etch steps in an equal number to the number of the semiconductor structures 253, 256, and 259. After step 15 is finished, the process-parameter prognostic system 190 may confirm linearity between the sensor parameters and the measured parameters (=the measured CDs).

Figure 8:
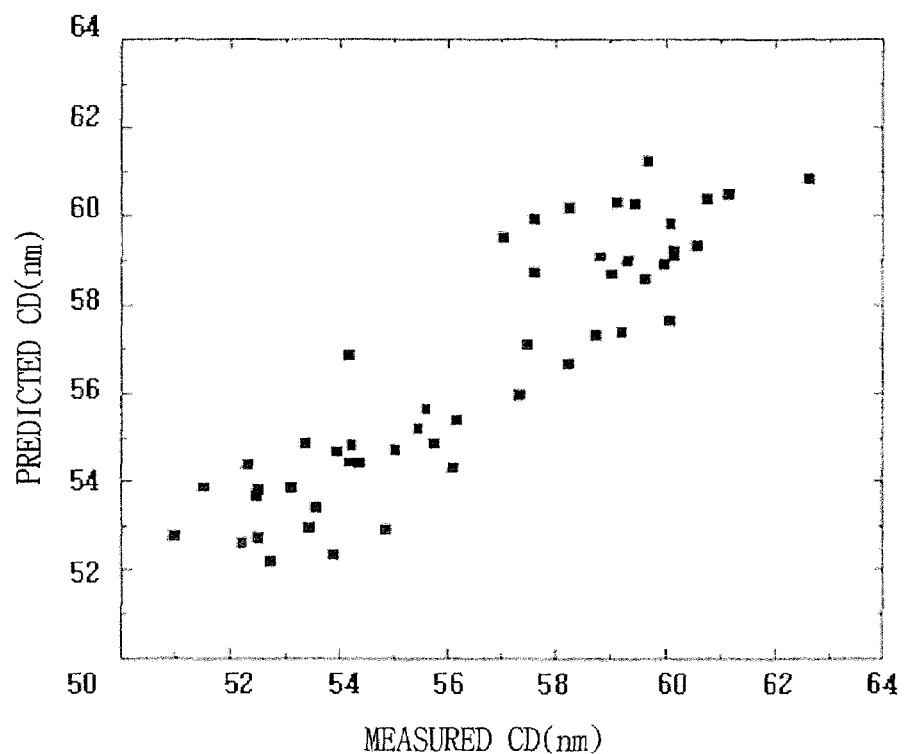
FIG. 8 is a graph showing linearity between measured parameters of semiconductor structures and sensor parameters of plasmas shown in FIG. 3C.

FIG. 8 is a graph showing linearity between measured parameters of semiconductor structures and sensor parameters of plasmas shown in FIG. 3C.

Referring to FIG. 8, in step 20 of determining a process-predicting model equation and a boundary condition shown in FIG. 1, the process-parameter prognostic system 190 may process the measured parameters (=the measured CDs) and sensor parameters of the semiconductor structures 259. The process-parameter prognostic system 190 may employ a process prediction unit 74 of FIG. 1 in order to process the measured parameters (=the measured CDs) and the sensor parameters of the semiconductor structures 259. The process prediction unit 74 may obtain a process-predicting basic model equation using the selected measured parameters and selected sensor parameters corresponding to ones selected from the semiconductor structures 259. It is assumed that the process-predicting basic model equation is obtained by expressing the selected measured parameters using a linear equation of the selected sensor parameters as follows.

$$\text{Measured CD} = a*A + b*B + c*C + d*D + e*E + f*F + g \qquad (1).$$

The process-predicting basic model equation may be expressed using sensor parameters (A, B) obtained during the first etch step, sensor parameters (C, D) obtained during the second etch step, and sensor parameters (E, F) obtained during the third etch step. The sensor parameters (A, B), (C, D), and (E, F) may be independent variables of the process-predicting basic model equation. Accordingly, ones (A, C, E) selected from the independent variables may be electron collision rates or electron densities. The remaining ones (B, D, F) of the independent variables may be electron densities or electron collision rates. The process-predicting basic model equation may include coefficients (a, b, c, d, e, f) of the independent variables. Also, the process-predicting basic model equation may include a variable "g" for compensating for a numerical value to approximate to the measured CD.

Referring again to FIG. 8, the process prediction unit 74 may substitute each of the selected measured parameters for the measured CD of the process-predicting basic model equation and continuously substitute the average value of the sensor parameters obtained during the first through third etch steps for the independent variables of the process-predicting basic model equation. The process prediction unit 74 may apply a known determinant to the selected measured parameters and selected sensor parameters of the process-predicting basic model equation and generate trends in coefficients and variables. The process prediction unit 74 may substitute new coefficients (a', b', c', d', e', f', g') and new variables into the process-predicting basic model equation and obtain a process-predicting model equation for predicting predicted parameters (=predicted CDs) as follows.

$$\text{Predicted CD} = a'*A + b'*B + c'*C + d'*D + e'*E + f'*F + g' \qquad (2).$$

Next, the process prediction unit 74 may substitute the selected sensor parameters into the process-predicting model equation and generate predicted parameters as shown in FIG. 8. In this case, it can be seen that a linear equation is obtained between the predicted parameters and the measured parameters.

Figure 9:
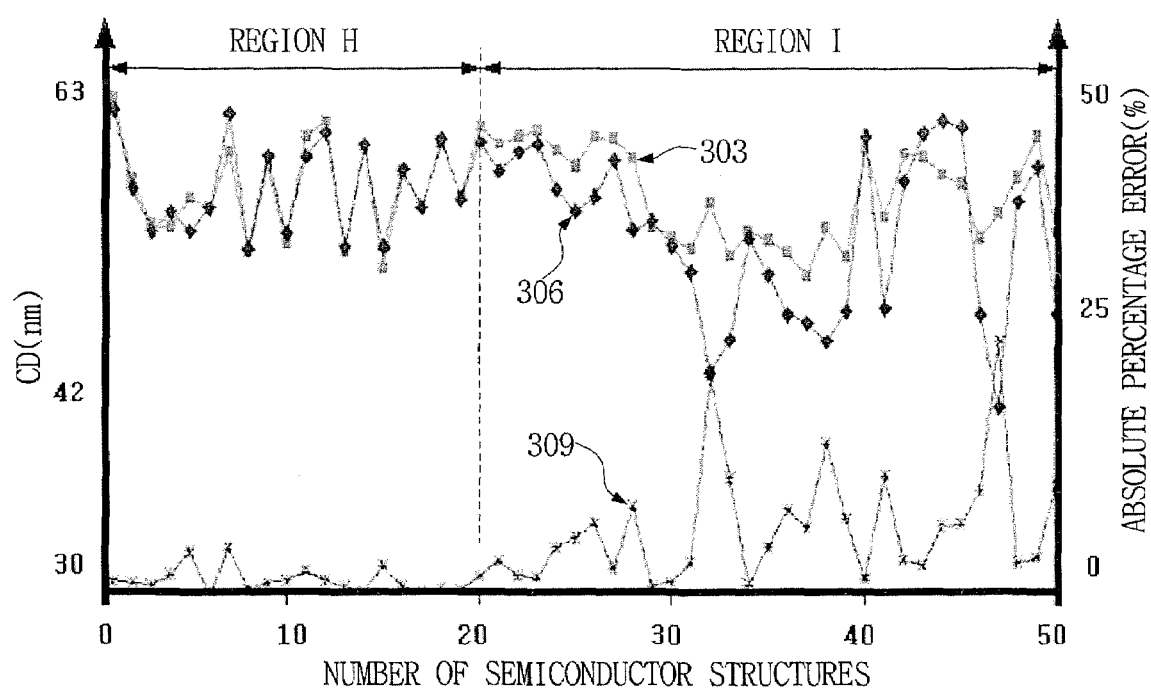
FIGS. 9 through 11 are graphs showing relationships between measured parameters and predicted parameters of semiconductor structures using a semiconductor fabrication apparatus shown in FIG. 2 according to a process flowchart of FIG. 1.
Figure 10:
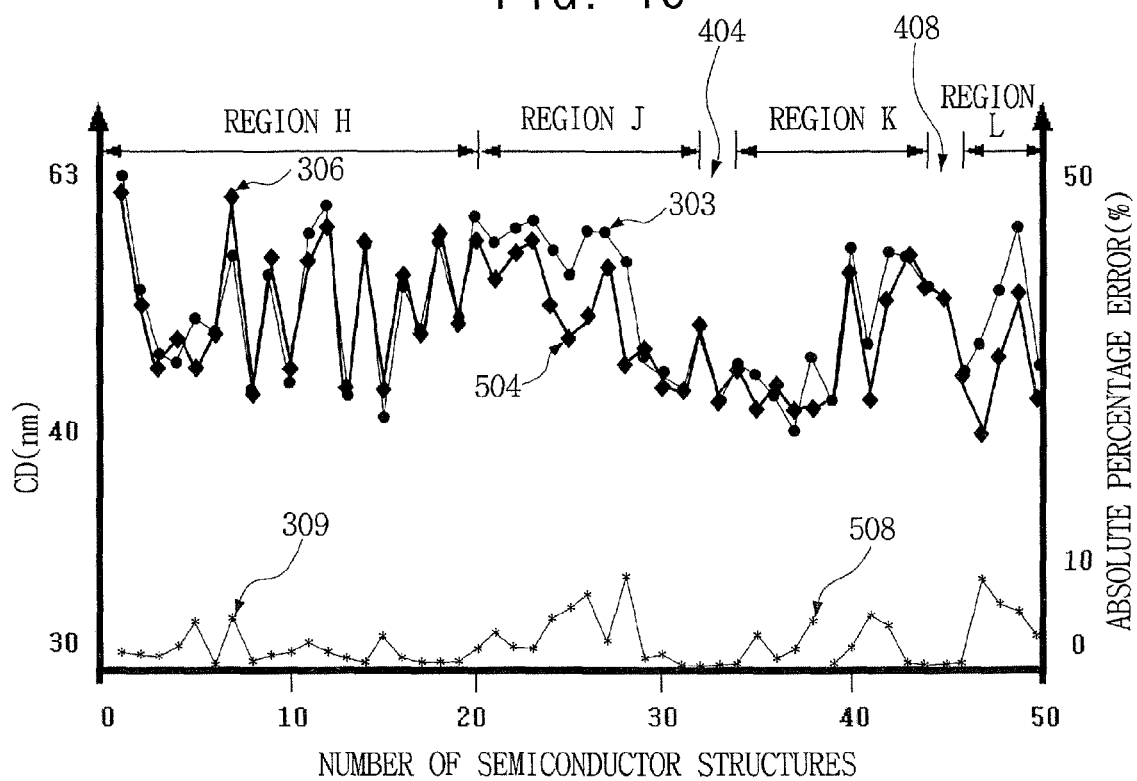

FIGS. 9 and 10 are graphs showing relationships between measured parameters and predicted parameters of semiconductor structures using a semiconductor fabrication apparatus shown in FIG. 2 according to a process flowchart of FIG. 1.

Referring to FIG. 9, after the process-predicting model equation of FIG. 8 is obtained, the semiconductor fabrication apparatus 200 may generate predicted parameters using only the process-parameter prognostic system 190 without the process prediction unit 74 of FIG. 1 in the process-parameter prognostic system 190. Also, the process-parameter prognostic system 190 may display the measured and predicted parameters on a monitor using the process-predicting model equation as shown in FIG. 9 during or after the performance of the semiconductor fabrication process. For this, the process prediction unit 74 may indicate the measured and predicted parameters on a measurement line 303 and a prediction line 306, respectively. In this case, the measured parameters may correspond one-to-one to the predicted parameters of the prediction line 306 along the measurement line 303 in a region H.

Referring again to FIG. 9, an absolute percentage error (=(|measured CD-predicted CD|/measured CD)*100) between the measured and predicted parameters may be 5% or less using a separation line 309 in the region H. The region H corresponds to a case where the number of the semiconductor structures 259 is less than 20. However, the measured and predicted parameters may follow the measurement line 303 and the prediction line 306 such that the measured parameters are separated from the predicted parameters in a region I. The absolute percentage error between the measured and predicted parameters may range from 5 to 25% using the separation line 309 in the region I. The region I corresponds to a case where the number of the semiconductor structures 259 is 20 or more after the process-predicting model equation is obtained. When comparing the region H with the region I, it can be seen from FIG. 9 that when the number of the semiconductor structures 259 is increased, the process-predicting model equation cannot predict the measured parameters using the predicted parameters. This is because the predicted parameters of the region I do not reflect the process environments of the process chamber 100 of FIG. 2.

Referring to FIG. 10, in order to address the problem described with reference to FIG. 9 caused by an increase in the number of the semiconductor structures 259, the semiconductor fabrication apparatus 200 of FIG. 2 may generate predicted parameters using only the process-parameter prognostic system 190 without the process prediction unit 74 of FIG. 1 in the process-parameter prognostic system 190. Although the semiconductor structures 259 are used in the same number as in FIG. 9, the process-parameter prognostic system 190 may divide a measurement line 303 and prediction lines 306 and 504 into four regions H, J, K, and L. The region H of FIG. 10 may have the same predicted and measured parameters as the region H of FIG. 9. The region J of FIG. 10 may have the same predicted and measured parameters as a portion of the region I of FIG. 9 when the number of the semiconductor structures 259 ranges from 20 to 30.

Referring again to FIG. 10, the process-parameter prognostic system 190 may correct the process-predicting model equation using measured parameters of a first correction period 404 in order to reduce the absolute percentage error between the predicted and measured parameters in the region J. Also, the process-parameter prognostic system 190 may generate predicted parameters in the region K using the corrected process-predicting model equation. An absolute percentage error between the measured and predicted parameters may be 5% or less using a separation line 508 in the region K. Subsequently, the process-parameter prognostic system 190 may re-correct the corrected process-predicting model equation using measured parameters of a second correction period 408 based on the same cycle. In addition, the process-parameter prognostic system 190 may generate predicted parameters in the region L using the re-corrected process-predicting model equation. However, the absolute percentage error between the measured and predicted parameters may be 10% or less using the separation line 508 in the region L. In other words, the absolute percentage error between the measured and predicted parameters in the region L may be in substantially the same range as the absolute percentage error between the measured and predicted parameters in the region J. This is because the predicted parameters of the region L do not reflect the process environments of the process chamber 100 of FIG. 2 in real-time.

Figure 7:
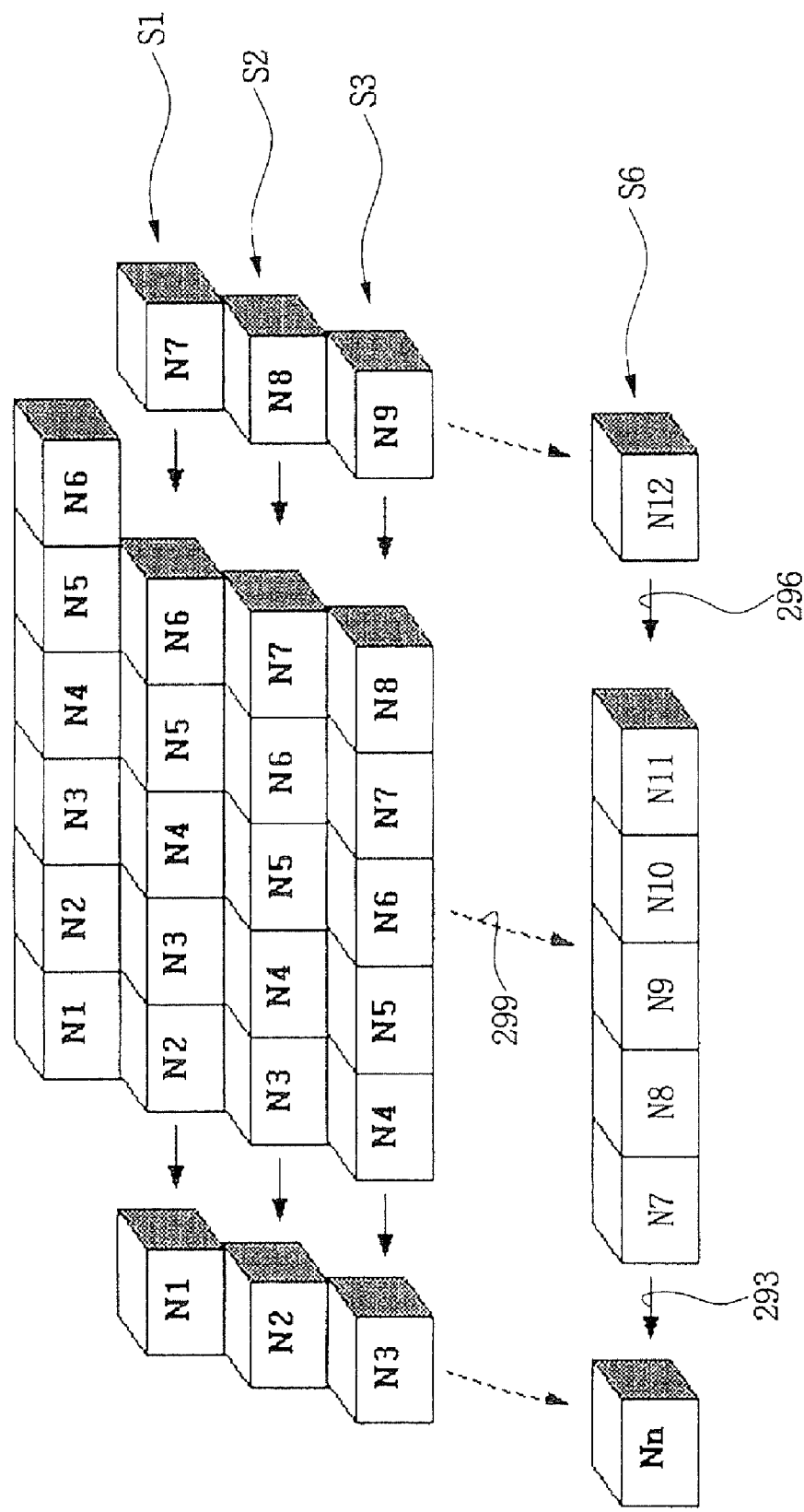
FIG. 7 is a schematic view illustrating a method of generating specific sensor parameters using a semiconductor fabrication apparatus shown in FIG. 2, according to a process flowchart of FIG. 1.

FIG. 7 is a schematic view illustrating a method of generating specific sensor parameters using a semiconductor fabrication apparatus shown in FIG. 2, according to a process flowchart of FIG. 1. And FIG. 11 is a graph showing relationships between measured parameters and predicted parameters of semiconductor structures using a semiconductor fabrication apparatus shown in FIG. 2 according to a process flowchart of FIG. 1.

Figure 11:
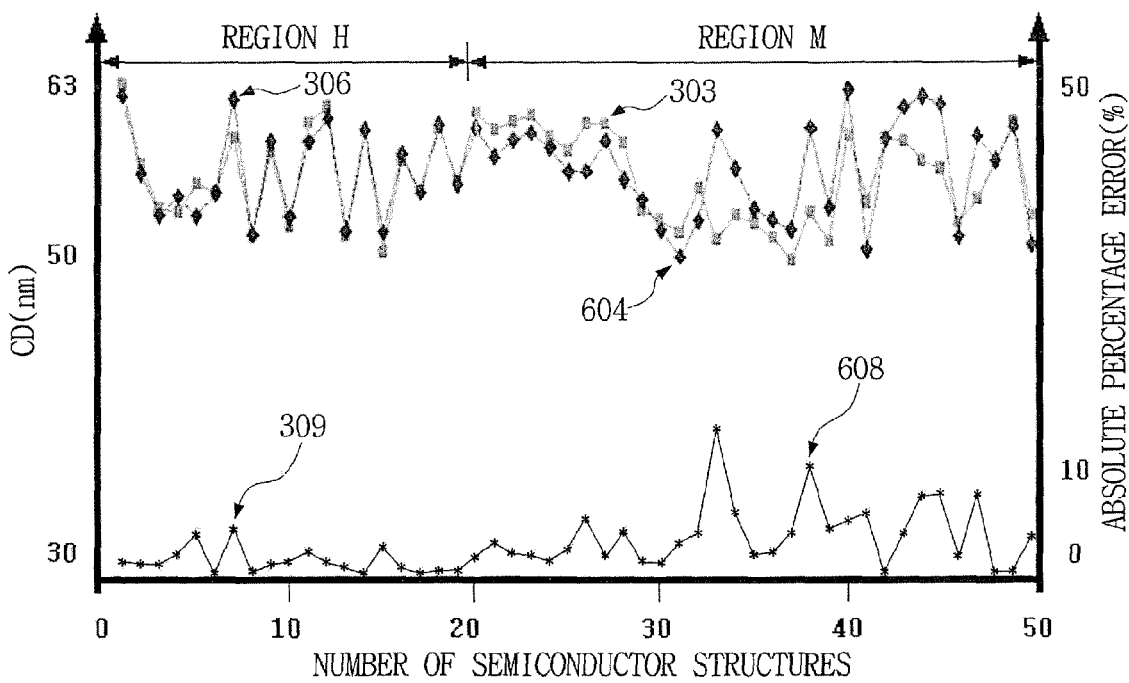

Referring to FIGS. 7 and 11, in order to address the problems described with reference to FIGS. 9 and 10, the semiconductor fabrication apparatus 200 of FIG. 2 may generate predicted parameters substantially corresponding one-to-one to measured parameters with reference to the process-predicting model equation using the process prediction unit 74 and a process-change point corresponding unit 78 shown in FIG. 1. For this, the process prediction unit 74 may determine a boundary condition in step 20 of FIG. 1. The boundary condition may be one selected from the group consisting of a maximum value, a minimum value, an intermediate value, an average value, a standard deviation value, which are obtained using the selected sensor parameters of FIG. 8 according to different process items, and a statistical value obtained using the above values. Examples of the selected sensor parameters and boundary condition may be arranged in the following Tables 1 and 2, respectively.

TABLE 1

| ID of semiconductor structure | Selected sensor parameters | | | | | | |
|---|---|---|---|---|---|---|---|
| | Measured CD | A- CR | B- Ne | C- CR | D- Ne | E- CR | F- Ne |
| 1 | 62.64 | 1.39E+09 | 5.04E+10 | 1.38E+07 | 1.49E+10 | 4.07E+08 | 1.71E+10 |
| 2 | 57.33 | 1.21E+09 | 4.74E+10 | 1.11E+07 | 1.75E+10 | 4.29E+08 | 1.78E+10 |
| 3 | 54.37 | 1.31E+09 | 4.77E+10 | 1.00E+07 | 1.82E+10 | 4.01E+08 | 1.78E+10 |
| 4 | 54.18 | 1.08E+09 | 4.92E+10 | 8.59E+06 | 1.94E+10 | 4.04E+08 | 1.75E+10 |
| 5 | 56.12 | 1.29E+09 | 4.78E+10 | 9.81E+06 | 1.81E+10 | 4.09E+08 | 1.79E+10 |
| 6 | 55.45 | 1.31E+09 | 4.73E+10 | 1.08E+07 | 1.79E+10 | 4.04E+08 | 1.77E+10 |
| 7 | 59.12 | 1.44E+09 | 5.00E+10 | 1.33E+07 | 1.48E+10 | 4.03E+08 | 1.72E+10 |
| 8 | 52.48 | 1.27E+09 | 4.72E+10 | 1.00E+07 | 1.80E+10 | 4.04E+08 | 1.80E+10 |
| 9 | 58.26 | 1.29E+09 | 5.02E+10 | 1.32E+07 | 1.50E+10 | 3.87E+08 | 1.72E+10 |
| 10 | 53.13 | 1.28E+09 | 4.74E+10 | 1.30E+07 | 1.72E+10 | 4.21E+08 | 1.81E+10 |
| 11 | 60.11 | 1.32E+09 | 4.95E+10 | 1.43E+07 | 1.51E+10 | 3.85E+08 | 1.70E+10 |
| 12 | 61.16 | 1.39E+09 | 5.08E+10 | 1.33E+07 | 1.50E+10 | 3.94E+08 | 1.71E+10 |
| 13 | 52.52 | 1.31E+09 | 4.72E+10 | 1.10E+07 | 1.78E+10 | 3.99E+08 | 1.79E+10 |
| 14 | 59.46 | 1.36E+09 | 4.99E+10 | 1.32E+07 | 1.48E+10 | 3.85E+08 | 1.71E+10 |
| 15 | 51.51 | 1.27E+09 | 4.71E+10 | 1.07E+07 | 1.77E+10 | 4.03E+08 | 1.79E+10 |
| 16 | 57.61 | 1.36E+09 | 5.02E+10 | 1.35E+07 | 1.54E+10 | 3.95E+08 | 1.73E+10 |
| 17 | 55.61 | 1.16E+09 | 4.95E+10 | 8.80E+06 | 1.87E+10 | 4.33E+08 | 1.79E+10 |
| 18 | 59.692 | 1.21E+09 | 4.89E+10 | 1.30E+07 | 1.54E+10 | 3.74E+08 | 1.70E+10 |
| 19 | 56.17 | 1.38E+09 | 4.73E+10 | 1.11E+07 | 1.72E+10 | 3.97E+08 | 1.80E+10 |
| 20 | 60.78 | 1.32E+09 | 4.96E+10 | 1.35E+07 | 1.48E+10 | 3.87E+08 | 1.72E+10 |

In Table 1, the identifications (IDs) of the semiconductor structures may be determined in the order of the semiconductor fabrication process. Reference characters A, B, C, D, E, and F may denote independent variables of the process-predicting model equation. Also, CR and Ne may denote an electron collision rate and an electron density, respectively.

TABLE 2

| ID of semiconductor structure | Statistical value | Measured CD | A- CR | B- Ne | C- CR | D- Ne | E- CR | F- Ne |
|---|---|---|---|---|---|---|---|---|
| 01-20 | Minimum | 51.51 | 1.08E+09 | 4.71E+10 | 8.59E+06 | 1.48E+10 | 3.74E+08 | 1.70E+10 |
| | Maximum | 62.64 | 1.44E+09 | 5.08E+10 | 1.43E+07 | 1.94E+10 | 4.33E+08 | 1.81E+10 |
| | Average | 56.89 | 1.30E+09 | 4.87E+10 | 1.18E+07 | 1.66E+10 | 4.01E+08 | 1.75E+10 |
| | Standard deviation | 3.24 | 8.58E+07 | 1.34E+09 | 1.79E+06 | 1.58E+09 | 1.46E+07 | 3.91E+08 |

Boundary conditions

In Table 2, the range 1-20 of the number of samples may denote first through twentieth semiconductor structures 259. Next, in step 25 of comparing the sensor parameters with the boundary condition shown in FIG. 1, the process prediction unit 74 may compare the sensor parameters of the remaining semiconductor structures 259 of FIG. 8 with the boundary condition. For example, the process prediction unit 74 may estimate the remaining sensor parameters based on the average statistical values of the boundary condition as shown in Table 3.

TABLE 3

Remaining sensor parameters

| ID of semiconductor structure | Measured CD | A- CR | B- Ne | C- CR | D- Ne | E- CR | F- Ne |
|---|---|---|---|---|---|---|---|
| 21 | 59.64 | 1.39E+09 | 4.93E+10 | 1.36E+07 | 1.48E+10 | 3.89E+08 | 1.73E+10 |
| 22 | 60.15 | 1.40E+09 | 4.98E+10 | 1.34E+07 | 1.48E+10 | 3.98E+08 | 1.73E+10 |
| 23 | 60.58 | 1.42E+09 | 5.02E+10 | 1.33E+07 | 1.48E+10 | 4.00E+08 | 1.73E+10 |
| 24 | 59.21 | 1.33E+09 | 5.34E+10 | 5.74E+06 | 2.05E+10 | 3.96E+08 | 1.75E+10 |
| 25 | 58.24 | 1.39E+09 | 5.25E+10 | 1.25E+07 | 1.76E+10 | 3.96E+08 | 1.76E+10 |
| 26 | 60.08 | 1.32E+09 | 4.91E+10 | 1.38E+07 | 1.61E+10 | 3.81E+08 | 1.74E+10 |
| 27 | 60 | 1.37E+09 | 4.99E+10 | 1.41E+07 | 1.55E+10 | 3.91E+08 | 1.74E+10 |
| 28 | 58.75 | 1.22E+09 | 5.14E+10 | 1.36E+07 | 1.69E+10 | 3.84E+08 | 1.75E+10 |
| 29 | 54.23 | 1.34E+09 | 4.73E+10 | 1.16E+07 | 1.71E+10 | 3.97E+08 | 1.81E+10 |
| 30 | 53.57 | 1.27E+09 | 4.80E+10 | 8.17E+06 | 1.84E+10 | 4.16E+08 | 1.82E+10 |
| 31 | 52.75 | 1.33E+09 | 4.53E+10 | 9.21E+06 | 1.85E+10 | 3.85E+08 | 1.81E+10 |
| 32 | 55.74 | 1.88E+09 | 7.00E+10 | 3.38E+06 | 2.01E+10 | 3.15E+08 | 1.71E+10 |
| 33 | 52.32 | 2.33E+09 | 7.89E+10 | 5.28E+06 | 1.97E+10 | 3.57E+08 | 1.79E+10 |
| 34 | 53.95 | 1.58E+09 | 5.37E+10 | 1.02E+07 | 1.77E+10 | 3.86E+08 | 1.82E+10 |
| 35 | 53.37 | 1.37E+09 | 5.43E+10 | 1.18E+07 | 1.71E+10 | 3.90E+08 | 1.81E+10 |
| 36 | 52.5 | 1.81E+09 | 5.94E+10 | 6.90E+06 | 1.86E+10 | 3.58E+08 | 1.82E+10 |
| 37 | 50.98 | 1.71E+09 | 5.90E+10 | 8.28E+06 | 1.85E+10 | 3.61E+08 | 1.82E+10 |
| 38 | 54.19 | 2.39E+09 | 8.33E+10 | 5.06E+06 | 1.97E+10 | 3.77E+08 | 1.82E+10 |
| 39 | 52.21 | 1.85E+09 | 6.24E+01 | 6.54E+06 | 1.91E+10 | 3.78E+08 | 1.83E+10 |
| 40 | 59.33 | 1.57E+09 | 5.28E+10 | 1.31E+07 | 1.69E+10 | 3.95E+08 | 1.73E+10 |
| 41 | 54.85 | 1.70E+09 | 5.91E+10 | 7.18E+06 | 1.88E+10 | 3.74E+08 | 1.82E+10 |
| 42 | 59.02 | 1.44E+09 | 5.21E+10 | 1.40E+07 | 1.64E+10 | 3.73E+08 | 1.72E+10 |
| 43 | 58.81 | 1.54E+09 | 5.11E+10 | 1.37E+07 | 1.61E+10 | 3.93E+08 | 1.72E+10 |
| 44 | 57.61 | 1.46E+09 | 5.06E+10 | 1.37E+07 | 1.62E+10 | 3.95E+08 | 1.71E+10 |
| 45 | 57.05 | 1.49E+09 | 5.06E+10 | 1.37E+07 | 1.60E+10 | 3.94E+08 | 1.72E+10 |
| 46 | 53.45 | 1.88E+09 | 6.41E+10 | 7.70E+06 | 1.88E+10 | 3.76E+08 | 1.82E+10 |
| 47 | 55.03 | 3.62E+09 | 1.16E+11 | 3.16E+06 | 2.09E+10 | 3.57E+08 | 1.81E+10 |
| 48 | 57.48 | 1.52E+09 | 5.25E+10 | 1.45E+07 | 1.68E+10 | 3.79E+08 | 1.73E+10 |
| 49 | 60.15 | 1.43E+09 | 5.20E+10 | 1.36E+07 | 1.65E+10 | 3.76E+08 | 1.72E+10 |
| 50 | 53.9 | 1.70E+09 | 5.97E+10 | 7.86E+06 | 1.88E+10 | 3.87E+08 | 1.84E+10 |

In Table 3, the remaining semiconductor structures 259 may be formed later than the selected semiconductor structures 259 shown in Table 1 in the order of the semiconductor fabrication process. The remaining sensor parameters may be greater than the average values of the boundary condition. When the remaining sensor parameters are greater than the average values of the boundary condition, the remaining sensor parameters may be illustrated with bold letters in Table 3. The remaining semiconductor structures 259 of which at least two sensor parameters are greater than the average values of the boundary condition may be categorized as poor semiconductor structures 259. For example, the $24^{th}$, $32^{nd}$, $33^{rd}$, $34^{th}$, $36^{th}$, $37^{th}$, $38^{th}$, $39^{th}$, $41^{st}$, $46^{th}$, $47^{th}$, $48^{th}$, and $50^{th}$ semiconductor structures 259 may be categorized as the poor semiconductor structures 250 because at least two sensor parameters thereof are greater than the average values of the boundary condition. The poor semiconductor structures 259 do not satisfy the boundary condition.

When the remaining sensor parameters satisfy the boundary condition, the process predicting unit 74 may rebuild the boundary condition using the selected semiconductor structures 259 and the remaining semiconductor structures 259 according to a method shown in FIG. 7 in step 30 of rebuilding the process-predicting model equation and the boundary condition shown in FIG. 1. The method shown in FIG. 7 may have a first flow line 293 through which a previously fabricated one of the selected semiconductor structures 259 is removed from the selected semiconductor structures 259 and a second flow line 296 through which a previously fabricated one of the remaining semiconductor structures 259 is added to the selected semiconductor structures 259. In addition, the method shown in FIG. 7 may have a third flow line 299 through which the semiconductor fabrication process is transferred from the selected semiconductor structures 259 and the remaining semiconductor structures 259 to subsequently fabricated semiconductor structures 259 in order to apply the first and second flow lines 293 and 296. Furthermore, the method shown in FIG. 7 may be repetitively performed in order through the first, second, and third lines 293, 296, and 299 using the selected semiconductor structures 259 and the remaining semiconductor structures 259 in the order of the semiconductor fabrication process.

Referring again to FIGS. 7 and 11, more specifically, the process prediction unit 74 may repetitively perform the method shown in FIG. 7 in order and generate specific sensor parameters S1, S2, S3, . . . , and S6. In this case, one S1 of the specific sensor parameters S1, S2, S3, . . . , and S6 may be generated by replacing sensor parameters of previously fabricated one N1 of the selected semiconductor structures N1, N2, N3, N4, N5, and N6 by sensor parameters of a previously fabricated one N7 of the remaining semiconductor structures N7, N8, N9, . . . , and N12. Also, the other one S2 of the specific sensor parameters S1, S2, S3, . . . , and S6 may be generated by replacing sensor parameters of a subsequently fabricated one N2 of the selected semiconductor structures N2, N3, N4, N5, N6, and N7 by sensor parameters of a subsequently fabricated one N8 of the remaining semiconductor structures N8, N9, . . . , and N12.

Moreover, the process prediction unit 74 may repetitively apply the method shown in FIG. 7, in order, to the selected semiconductor structures N3, N4, N5, N6, N7, and N8 and the remaining semiconductor structures N9, N10, . . . , and N12 and generate the specific parameters S3, S4, . . . , and S6. The specific sensor parameters S1, S2, S3, . . . , and S6 may be classified to correspond to process items (=an electron collision rate and an electron density) of the first through third etch steps. The number of the specific sensor parameters S1, S2, S3, . . . , and S6 is limited for brevity and may be more than 6 to correspond to the number of semiconductor structures. Accordingly, the reference numerals of the specific sensor parameters S1, S2, S3, . . . , and S6 will now be omitted to aid in comprehensive description of exemplary embodiments.

After the specific sensor parameters are generated, the process prediction unit 74 may calculate the specific sensor parameters according to the process items. For this, the process prediction unit 74 may apply a calculation for obtaining the boundary condition shown in Table 2 to the specific parameters. Accordingly, the specific parameters may be used to obtain statistical values, such as a minimum value, a maximum value, an average value, and a standard deviation value. The statistic values may provide new boundary conditions to the specific parameters. The new boundary conditions may be determined by rebuilding the boundary conditions shown in Table 2 using the specific parameters.

TABLE 4

Rebuilt boundary conditions

| Range of number of samples (ID of predicted semiconductor structure) | Statistical value | A- CR | B- Ne | C- CR | D- Ne | E- CR | F- Ne |
|---|---|---|---|---|---|---|---|
| 01-20 | Minimum value | 1.08E+09 | 4.71E+10 | 8.59E+06 | 1.48E+10 | 3.74E+08 | 1.70E+10 |
|  | Maximum value | 1.44E+09 | 5.08E+10 | 1.43E+07 | 1.94E+10 | 4.33E+08 | 1.81E+10 |
|  | Average value | 1.30E+09 | 4.87E+10 | 1.18E+07 | 1.66E+10 | 4.01E+08 | 1.75E+10 |
|  | Standard deviation | 8.58E+07 | 1.34E+09 | 1.79E+06 | 1.58E+09 | 1.46E+07 | 3.91E+08 |
| 02-21 | Minimum value | 1.08E+09 | 4.71E+10 | 8.59E+06 | 1.48E+10 | 3.74E+08 | 1.70E+10 |
|  | Maximum value | 1.44E+09 | 5.08E+10 | 1.43E+07 | 1.94E+10 | 4.33E+08 | 1.81E+10 |
| (21) | Average value | 1.30E+09 | 4.87E+10 | 1.18E+07 | 1.66E+10 | 4.00E+08 | 1.75E+10 |
|  | Standard deviation | 8.58E+07 | 1.29E+09 | 1.78E+06 | 1.59E+09 | 1.48E+07 | 3.79E+08 |

TABLE 4-continued

| Range of number of samples (ID of predicted semiconductor structure) | Statistical value | A- CR | B- Ne | C- CR | D- Ne | E- CR | F- Ne |
|---|---|---|---|---|---|---|---|
| 03-22 | Minimum value | 1.08E+09 | 4.71E+10 | 8.59E+06 | 1.48E+10 | 3.74E+08 | 1.70E+10 |
|  | Maximum value | 1.44E+09 | 5.08E+10 | 1.43E+07 | 1.94E+10 | 4.33E+08 | 1.81E+10 |
| (22) | Average value | 1.31E+09 | 4.88E+10 | 1.19E+07 | 1.65E+10 | 3.98E+08 | 1.75E+10 |
|  | Standard deviation | 8.61E+07 | 1.28E+09 | 1.80E+06 | 1.63E+09 | 1.32E+07 | 3.76E+08 |
| 04-23 | Minimum value | 1.08E+09 | 4.71E+10 | 8.59E+06 | 1.48E+10 | 3.74E+08 | 1.70E+10 |
|  | Maximum value | 1.44E+09 | 5.08E+10 | 1.43E+07 | 1.94E+10 | 4.33E+08 | 1.81E+10 |
| (23) | Average value | 1.31E+09 | 4.89E+10 | 1.21E+07 | 1.63E+10 | 3.98E+08 | 1.75E+10 |
|  | Standard deviation | 9.01E+07 | 1.29E+09 | 1.77E+06 | 1.62E+09 | 1.32E+07 | 3.71E+08 |
| 05-24 | Minimum value | 1.16E+09 | 4.71E+10 | 5.74E+06 | 1.48E+10 | 3.74E+08 | 1.70E+10 |
|  | Maximum value | 1.44E+09 | 5.34E+10 | 1.43E+07 | 2.05E+10 | 4.33E+08 | 1.81E+10 |
| (24) | Average value | 1.32E+09 | 4.91E+10 | 1.19E+07 | 1.64E+10 | 3.98E+08 | 1.75E+10 |
|  | Standard deviation | 7.09E+07 | 1.63E+09 | 2.14E+06 | 1.74E+09 | 1.31E+07 | 3.71E+08 |
| 05-25 | Minimum value | 1.16E+09 | 4.71E+10 | 8.80E+06 | 1.48E+10 | 3.74E+08 | 1.70E+10 |
|  | Maximum value | 1.44E+09 | 5.25E+10 | 1.43E+07 | 1.87E+10 | 4.33E+08 | 1.81E+10 |
| (25) | Average value | 1.33E+09 | 4.91E+10 | 1.23E+07 | 1.62E+10 | 3.98E+08 | 1.75E+10 |
| Excluding 24 | Standard deviation | 7.23E+07 | 1.52E+09 | 1.57E+06 | 1.49E+09 | 1.31E+07 | 3.71E+08 |
| 06-26 | Minimum value | 1.16E+09 | 4.71E+10 | 8.80E+06 | 1.48E+10 | 3.74E+08 | 1.70E+10 |
|  | Maximum value | 1.44E+09 | 5.25E+10 | 1.43E+07 | 1.87E+10 | 4.33E+08 | 1.81E+10 |
| (26) | Average value | 1.33E+09 | 4.91E+10 | 1.25E+07 | 1.61E+10 | 3.97E+08 | 1.75E+10 |
| Excluding 24 | Standard deviation | 7.17E+07 | 1.49E+09 | 1.50E+06 | 1.43E+09 | 1.34E+07 | 3.57E+08 |

In Table 4A, the range of the number of samples may refer to the number of semiconductor structures 259 that belong to a group to form the specific parameters. For example, the range 1__20 of the number of samples may refer to a group of first through $20^{th}$ semiconductor structures 259. The predicted semiconductor structure may be a structure corresponding to the specific sensor parameters. The ID of the predicted semiconductor structure may be parenthesized and correspond to a number (e.g., (21, 22, 23, 24, 25, or 26)) assigned in the order of the semiconductor fabrication process. During the arrangement of Table 4A, the process prediction unit 74 may exclude sensor parameters of the poor semiconductor structure 259, which do not satisfy the boundary conditions shown in Table 2, from the calculation of the new boundary conditions.

The poor semiconductor structure 259 may be a $24^{th}$ semiconductor structure shown in Table 4A. In detail, the process prediction unit 74 may add sensor parameters of the poor semiconductor structure 259, which do not satisfy the boundary conditions shown in Table 2, to the selected semiconductor structures 259, generate specific sensor parameters beforehand, and allow the specific sensor parameters to correspond to the predicted semiconductor structure. Also, the process prediction unit 74 may not allow the sensor parameters of the poor semiconductor structure 259 to correspond to the next predicted semiconductor structure in the order of the semiconductor fabrication process.

TABLE 4B

| Range of number of samples (ID of predicted semiconductor structure) | Statistical values | A- CR | B- Ne | C- CR | D- Ne | E- CR | F- Ne |
|---|---|---|---|---|---|---|---|
| 11-31 | Minimum value | 1.16E+09 | 4.53E+10 | 8.17E+06 | 1.48E+10 | 3.74E+08 | 1.70E+10 |
|  | Maximum value | 1.42E+09 | 5.25E+10 | 1.43E+07 | 1.87E+10 | 4.33E+08 | 1.82E+10 |
| (31) | Average value | 1.33E+09 | 4.91E+10 | 1.23E+07 | 1.63E+10 | 3.94E+08 | 1.75E+10 |
| Excluding 24 | Standard deviation | 7.02E+07 | 1.70E+09 | 1.85E+06 | 1.45E+09 | 1.29E+07 | 3.83E+08 |
| 12-32 | Minimum value | 1.16E+09 | 4.53E+10 | 3.38E+06 | 1.48E+10 | 3.15E+08 | 1.70E+10 |
|  | Maximum value | 1.88E+09 | 7.00E+10 | 1.41E+07 | 2.01E+10 | 4.33E+08 | 1.82E+10 |
| (32) | Average value | 1.35E+09 | 5.02E+10 | 1.17E+07 | 1.66E+10 | 3.91E+08 | 1.75E+10 |
| Excluding 24 | Standard deviation | 1.43E+08 | 4.97E+09 | 2.66E+06 | 1.65E+09 | 2.19E+07 | 3.77E+08 |
| 12-33 | Minimum value | 1.16E+09 | 4.53E+10 | 5.28E+06 | 1.48E+10 | 3.57E+08 | 1.70E+10 |
|  | Maximum value | 2.33E+09 | 7.89E+10 | 1.41E+07 | 1.97E+10 | 4.33E+08 | 1.82E+10 |
| (33) | Average value | 1.38E+09 | 5.06E+10 | 1.18E+07 | 1.65E+10 | 3.93E+08 | 1.76E+10 |
| Excluding 24 and 32 | Standard deviation | 2.35E+08 | 6.88E+09 | 2.36E+06 | 1.60E+09 | 1.53E+07 | 3.73E+08 |
| 12-34 | Minimum value | 1.16E+09 | 4.53E+10 | 8.17E+06 | 1.48E+10 | 3.74E+08 | 1.70E+10 |
|  | Maximum value | 1.58E+09 | 5.37E+10 | 1.41E+07 | 1.87E+10 | 4.33E+08 | 1.82E+10 |
| (34) | Average value | 1.34E+09 | 4.93E+10 | 1.21E+07 | 1.65E+10 | 3.94E+08 | 1.76E+10 |
| Excluding 24, 32, and 33 | Standard deviation | 9.07E+07 | 1.99E+09 | 1.84E+06 | 1.45E+09 | 1.29E+07 | 3.90E+08 |

Table 4B may show rebuilt boundary conditions of $31^{st}$, $32^{nd}$, $33^{rd}$, and $34^{th}$ semiconductor structures 259 that may be calculated after the $26^{th}$ semiconductor structure 259 shown in Table 3. In this case, the process prediction unit 74 may add sensor parameters of each of the poor semiconductor structures 259, which do not satisfy the boundary conditions shown in Table 2, to the selected semiconductor structures 259, generate specific sensor parameters beforehand, and allow the specific sensor parameters to correspond to the predicted semiconductor structure. The poor semiconductor structures 259 may be the 32nd and $33^{rd}$ semiconductor structures 259 shown in Table 4B. Also, the process prediction unit 74 may not allow the sensor parameters of each of the poor semiconductor structures 259 to the next predicted semiconductor structure in the order of the semiconductor fabrication process. As a result, the process prediction unit 74 may generate rebuilt boundary conditions of sensor parameters of subsequent semiconductor structures 259 that follow the $34^{th}$ semiconductor structure 259.

Referring again to FIGS. 7 and 11, the process prediction unit 74 may rebuild the process-predicting model equation using each of the boundary conditions rebuilt in step 30 of FIG. 1. In detail, the process prediction unit 74 may rebuild the process-predicting model equation by substituting average values of the respective process items of the rebuilt boundary conditions into independent variables of the process-predicting model equation. That is, the process-predicting model equation may be rebuilt using data shown in Tables 1 and 2 and the rebuilt boundary conditions. The rebuilding of the process-predicting mode equation may lead to changes in coefficients and variables of the process-predicting model equation according to each of the rebuilt boundary conditions. As a result, the process prediction unit 74 may generate a plurality of rebuilt process-predicting model equations corresponding to the semiconductor structures.

Next, the process prediction unit 74 may generate predicted parameters (=predicted CDs) using the rebuilt boundary conditions and the rebuilt process-predicting model equations in step 34 of obtaining predicted parameters shown in FIG. 1. In detail, the process prediction unit 74 may substitute the average values of the rebuilt boundary conditions into the rebuilt process-predicting model equations and generate a plurality of predicted parameters corresponding to semiconductor structures. Since the predicted parameters reflect the process environments of the process chamber 100 of FIG. 2 in real-time unlike in FIGS. 9 and 10, the predicted parameters may substantially correspond to measured parameters. Accordingly, the predicted parameters may be numerical values for estimating the measured parameters (=measured CDs).

TABLE 5

Measured and predicted CDs

| ID of predicted semiconductor structure | Measured CD (nm) | Predicted CD (nm) | CD error (nm) |
|---|---|---|---|
| 21 | 59.64 | 57.84 | 1.80 |
| 22 | 60.15 | 59.12 | 1.03 |
| 23 | 60.58 | 59.65 | 0.93 |
| 24 | 59.21 | 56.68 | 2.53 |
| 25 | 58.24 | 55.23 | 3.01 |
| 26 | 60.08 | 56.16 | 3.92 |
| 31 | 52.75 | 52.75 | 0.000 |
| 32 | 55.74 | 55.74 | 0.000 |
| 33 | 52.32 | 52.32 | 0.000 |
| 34 | 53.95 | 53.84 | 0.105 |

In Table 5, it may be assumed that the ID of the predicted semiconductor structure is the same as the ID of the semiconductor structure. Table 5 may show predicted parameters of the predicted semiconductor structures shown in Tables 4A and 4B. As can be seen from Table 5, CD errors between the measured and predicted parameters may be very small. That is, the predicted parameters may be substantially the same as the measured parameters. Accordingly, the predicted parameters may desirably estimate the measured parameters. The process prediction unit 74 may display the measured and predicted parameters of the semiconductor structures shown in Tables 1 and 3 on the monitor of the process-parameter prognostic system 190 of FIG. 2, which can be seen as shown in FIG. 11. For this, the process prediction unit 74 may indicate the measured and predicted parameters on the measurement line 303 and prediction lines 306 and 604. In this case, as in FIGS. 9 and 10, the predicted parameters may correspond one-to-one to the measured parameters along the measurement and prediction lines 303 and 306 in the region H.

Like in the region H, the predicted parameters may substantially correspond one-to-one to the measured parameters along the measurement and prediction lines 303 and 604 in the region M. Although the predicted parameters generally deviate from the measured parameters past the regions H and M, CD errors between the predicted and measured parameters are far smaller than in the region I of FIG. 9. In this case, an absolute percentage error between the predicted and measured parameters may be 10% or less along the separation line 309 of the region H and a separation line 608 of the region M. Also, as compared with the regions J and K of FIG. 10, the predicted parameters may have a stable CD distribution along the prediction line 604 past the region M. This is because the predicted parameters reflect the process environments of the process chamber 100 of FIG. 2 in real-time using the specific sensor parameters.

Referring again back to FIGS. 7 and 11, for brevity, it is described that the process prediction unit 74 processes the semiconductor structures 259 at one time in step 25, step 30, and step 34 of generating predicted parameters (not described above). However, the process prediction unit 74 may process only one of the remaining semiconductor structures 259 shown in Table 3 in each of steps 25, 30, and 34. Accordingly, the process prediction unit 74 may generate specific sensor parameters and predicted parameters corresponding to the one of the remaining semiconductor structures 259 in each of steps 25, 30, and 34.

As a result, the process prediction unit 74 may allow predicted parameters corresponding to the one of the remaining semiconductor structures 259 to correspond to a final semiconductor structure 259 in step 38 of comparing predicted parameters with a final semiconductor structure shown in FIG. 1. In this case, the process prediction unit 74 may compare an ID of a predicted semiconductor structure of the predicted parameter with an ID of the final semiconductor structure 259. When the predicted parameter corresponding to the one of the remaining semiconductor structures 259 corresponds to the final semiconductor structure 259, the process prediction unit 74 may store the predicted parameter corresponding to the one of the remaining semiconductor structures 259 in the process-parameter prognostic system 190 of FIG. 2. When the predicted parameter corresponding to the one of the remaining semiconductor structures 259 does not correspond to the final semiconductor structure 259, the process prediction unit 74 may repetitively perform steps 25, 30, 34, and 38 of FIG. 1 in order and generate a plurality of predicted parameters using sensor parameters of each of the remaining semiconductor structures 259 until the ID of the final semiconductor structure 259 is found.

After the ID of the final semiconductor structure 259 is found, the process-parameter prognostic system 190 may indicate trends in measured and predicted parameters as shown in FIG. 11 in step 40 of comparing measured parameters with predicted parameters shown in FIG. 1. Meanwhile, when the remaining sensor parameters of each of the poor semiconductor structures 259 shown in Table 3 do not satisfy the boundary conditions in step 25 of FIG. 1, the process prediction unit 74 may transmit the remaining sensor parameters of each of the poor semiconductor structures 259 to the process-change point corresponding unit 78. The process-change point corresponding unit 78 may compare the remaining sensor parameters of each of the poor semiconductor structures 259 with the selected sensor parameters shown in Table 1 in step 55 of confirming generation of a process-change point shown in FIG. 1. This is because the process-change point corresponding unit 78 may confirm the process environments of the process chamber 100 against the poor semiconductor structures 259 and a process-change point of the semiconductor fabrication process from the selected sensor parameters.

When the process-change point is not generated, the process-change point corresponding unit 78 may transmit the remaining sensor parameters of each of the poor semiconductor structures 259 to the process prediction unit 74 in step 60 of managing sensor parameters shown in FIG. 1. As a result, the process prediction unit 74 may continuously manage the remaining sensor parameters of each of the poor semiconductor structures 259. Also, the process prediction unit 74 may perform steps 30 and 34 of FIG. 1 using the remaining sensor parameters of each of the poor semiconductor structures 259 and generate a predicted parameter of each of the poor semiconductor structures 259 as shown in Table 5. In addition, when the predicted parameter of each of the poor semiconductor structures 259 does not correspond to the ID of the final semiconductor structure 259 in step 38 of FIG. 1, the process prediction unit 74 may repetitively perform steps 25, 30, 34, and 38 of FIG. 1 in order using the remaining sensor parameters of each of the poor semiconductor structures 259.

When the process-change point is generated, the process-change point corresponding unit 78 may remove the remaining sensor parameters of each of the poor semiconductor structures 259 in step 50 of removing sensor parameters shown in FIG. 1. Also, the process-change point corresponding unit 78 may stop the drive of the semiconductor fabrication apparatus 200 of FIG. 2, recognize the cause of the process-change point, and take measures against the process-change point in step 45 of taking measures against a process-change point shown in FIG. 1. After the measures are taken against the process-change point, the process-change point corresponding unit 78 may continuously drive the semiconductor fabrication apparatus 200 to return to step 10 of FIG. 1.

As described above, exemplary embodiments provide a process-parameter prognostic system for predicting the shape of a semiconductor structure using sensor parameters of plasma that reacts with the semiconductor structure, a semiconductor fabrication apparatus having the process-parameter prognostic system, and a method of using the apparatus. As a result, the size of the shape of the semiconductor structure may be predicted using predicted parameters generated during or after performance of the semiconductor fabrication process.

Furthermore, the exemplary embodiments are limited to a plasma etching process of a semiconductor fabrication process, but it may be applied to a plasma deposition process of the semiconductor fabrication process. Thus, the shape of a semiconductor structure related with a deposited thickness may be predicted during or after performance of the plasma deposition process. According to the exemplary embodiments as described above, since measured parameters of a semiconductor structure may be predicted using predicted parameters extracted from plasma, the time taken to perform the semiconductor fabrication process on the semiconductor structure can be reduced.

The exemplary embodiments have been disclosed herein and, although specific terms are employed, they are used and are to be interpreted in a generic and descriptive sense only and not for limitation. Accordingly, it will be understood by those of ordinary skill in the art that various changes in form and details may be made without departing from the spirit and scope of the exemplary embodiments as set forth in the following claims.

What is claimed is:
1. A process-parameter prognostic system comprising:
a process prediction unit configured to calculate predicted parameters using measured parameters of semiconductor structures and sensor parameters associated with plasmas in a process chamber used to form the semiconductor structures, wherein the process prediction unit is further configured to provide a process-predicting model based on selected measured parameters and selected predicted parameters of selected semiconductor structures and configured to repetitively update the process-predicting model based on the sensor parameters by adjusting a number of the selected semiconductor structures and a number of remaining semiconductor structures in an order of a semiconductor fabrication process to provide remaining predicted parameters corresponding to the process-predicting model; and
a process-change point corresponding unit configured to compare selected sensor parameters corresponding to the selected predicted parameters with the remaining sensor parameters corresponding to the remaining predicted parameters to confirm process environments in the process chamber;
wherein each of the semiconductor structures is one selected from a structure on a semiconductor substrate and a structure including a material layer on and different from the semiconductor substrate, the measured parameters comprise actual numerical figures for limiting the shape of the semiconductor structures, and the predicted parameters are expected numerical figures for estimating the shape of the semiconductor structures;
wherein the sensor parameters are classified to correspond to at least two different process items, and the at least two different process items correspond to the semiconductor structures, respectively, and correspond to independent variables of the process-predicting model, respectively;
wherein each of the sensor parameters comprises an average radio frequency of a waveform obtained between specific points in time during performance of the semiconductor fabrication process;
wherein the process-predicting model is linear between the selected measured parameters and the selected predicted parameters;
wherein the process prediction unit is configured to determine a boundary condition for the process-predicting model using the selected sensor parameters and is configured to compare the boundary condition with the remaining parameters;

wherein the boundary condition is one selected from a maximum value, a minimum value, an average value, a standard deviation value, which are obtained using the sensor parameters according to the at least two different process items, and a statistical value obtained using the maximum value, the minimum value, the average value, and/or the standard deviation value;

wherein when the remaining sensor parameters satisfy the boundary condition, the process prediction unit replaces a previously fabricated one of the selected semiconductor structures with a previously fabricated one of the remaining semiconductor structures to generate a first specific predicted parameter, replaces a subsequently fabricated one of the selected semiconductor structures with a subsequently fabricated one of the remaining semiconductor structures to generate a second specific predicted parameter, and repetitively performs the same process as the process of generating each of the first and second specific predicted parameters in order to generate the predicted parameters, and wherein the boundary condition is repetitively updated based on the process-predicting model using the selected sensor parameters and the remaining sensor parameters.

2. A process-parameter prognostic system comprising:

a process prediction unit configured to calculate predicted parameters using measured parameters of semiconductor structures and sensor parameters associated with plasmas in a process chamber used to form the semiconductor structures, wherein the process prediction unit is further configured to provide a process-predicting model based on selected measured parameters and selected predicted parameters of selected semiconductor structures and configured to repetitively update the process-predicting model based on the sensor parameters by adjusting a number of the selected semiconductor structures and a number of remaining semiconductor structures in an order of a semiconductor fabrication process to provide remaining predicted parameters corresponding to the process-predicting model;

a process-change point corresponding unit configured to compare selected sensor parameters corresponding to the selected predicted parameters with the remaining sensor parameters corresponding to the remaining predicted parameters to confirm process environments in the process chamber;

wherein each of the semiconductor structures is one selected from a structure on a semiconductor substrate and a structure including a material layer on and different from the semiconductor substrate, the measured parameters comprise actual numerical figures for limiting the shape of the semiconductor structures, and the predicted parameters are expected numerical figures for estimating the shape of the semiconductor structures;

wherein the sensor parameters are classified to correspond to at least two different process items, and the at least two different process items correspond to the semiconductor structures, respectively, and correspond to independent variables of the process-predicting model, respectively;

wherein each of the sensor parameters comprises an average radio frequency of a waveform obtained between specific points in time during performance of the semiconductor fabrication process;

wherein the process-predicting model is linear between the selected measured parameters and the selected predicted parameters;

wherein the process prediction unit is configured to determine a boundary condition for the process-predicting model using the selected sensor parameters and is configured to compare the boundary condition with the remaining parameters;

wherein the boundary condition is one selected from a maximum value, a minimum value, an average value, a standard deviation value, which are obtained using the sensor parameters according to the at least two different process items, and a statistical value obtained using the maximum value, the minimum value, the average value, and/or the standard deviation value;

wherein when sensor parameters corresponding to the at least two different process items of the remaining sensor parameters do not satisfy the boundary condition, the process prediction unit transmits the sensor parameters corresponding to the at least two different process items to the process-change point corresponding unit, and the process-change point corresponding unit is configured to confirm the process environments in the process chamber based on the sensor parameters corresponding to the at least two different process items and the selected sensor parameters to select one of a management or a removal of the sensor parameters corresponding to the at least two different process items.

3. The system according to claim 2, wherein when the process-change point corresponding unit is configured to selectively remove the sensor parameters corresponding to the at least two different process items and is further configured to stop the drive of a semiconductor fabrication apparatus.

4. A semiconductor fabrication apparatus having a process-parameter prognostic system, the apparatus comprising:

a process chamber configured to generate plasmas between semiconductor structures and a process gas;

a sensor disposed on a sidewall of the process chamber and configured to sample sensor parameters associated with the plasmas;

a memory module configured to store measured parameters of the semiconductor structures removed from the process chamber; and the process-parameter prognostic system electrically connected to the sensor and the memory module and including a process prediction unit and a process-change point corresponding unit configured to provide predicted parameters using the process prediction unit and the process-change point corresponding unit, wherein the process prediction unit provides a process-predicting model based on selected measured parameters and selected predicted parameters of selected semiconductor structures and repetitively updates the process-predicting model based on the sensor parameters by adjusting a number of the selected semiconductor structures and a number of the remaining semiconductor structures in an order of a semiconductor fabrication process to obtain a remaining predicted parameters corresponding to the process-predicting model, and the process-change point corresponding unit is further configured to compare selected parameters corresponding to the selected predicted parameters with the remaining sensor parameters corresponding to the remaining predicted parameters and configured to confirm a process-change point in the process chamber wherein when the remaining sensor parameters satisfy a boundary condition, the process prediction unit repetitively performs the following two operations to generate the predicted parameters:

(1) replaces a previously fabricated one of the selected semiconductor structures with a previously fabricated one of the remaining semiconductor structures to generate a first specific predicted parameter;

(2) replaces a subsequently fabricated one of the selected semiconductor structures with a subsequently fabricated one of the remaining semiconductor structures to generate a second specific predicted parameter; and wherein the boundary condition is repetitively updated based on the process-predicting model using the selected sensor parameters and the remaining sensor parameters.

5. The apparatus according to claim 4, wherein the process prediction unit is configured to update the boundary condition for the process-predicting model using the sensor parameters and configured to compare the boundary condition with the remaining sensor parameters, and when a portion of the remaining sensor parameters does not satisfy the boundary condition, the process-change point corresponding unit is configured to allow the portion of the remaining sensor parameters to correspond to the selected sensor parameters and is configured to confirm the process environments in the process chamber.

* * * * *